(12) United States Patent
Liu et al.

(10) Patent No.: US 6,909,554 B2
(45) Date of Patent: Jun. 21, 2005

(54) WAFER INTEGRATION OF MICRO-OPTICS

(75) Inventors: Yue Liu, Plymouth, MN (US); Klein L. Johnson, Orono, MN (US); James A. Cox, New Brighton, MN (US); Bernard S. Fritz, Eagan, MN (US)

(73) Assignee: Finisar Corporation, Sunnyvale, CA (US)

( * ) Notice: Subject to any disclaimer, the term of this patent is extended or adjusted under 35 U.S.C. 154(b) by 321 days.

(21) Appl. No.: 10/351,710

(22) Filed: Jan. 27, 2003

(65) Prior Publication Data

US 2005/0052751 A1 Mar. 10, 2005

Related U.S. Application Data

(63) Continuation-in-part of application No. 09/749,296, filed on Dec. 27, 2000, now Pat. No. 6,556,349.

(51) Int. Cl.[7] .......................... G02B 27/10; H01L 27/00; H01L 27/148; H04N 5/225; G03B 13/24
(52) U.S. Cl. ...................... 359/626; 359/619; 359/621; 359/455; 359/719; 250/208.1; 250/201.8; 348/340; 355/44; 257/232; 257/233; 257/432; 427/162
(58) Field of Search ................................ 359/626, 619, 359/621, 455, 719; 250/201.8, 208.1, 214.1; 348/340; 355/40, 44; 257/59, 232, 233, 432, 290, 291, 292; 427/162, 163.2

(56) References Cited

U.S. PATENT DOCUMENTS

| | | | |
|---|---|---|---|
| 3,976,862 A | | 8/1976 | Curbelo ........................ 702/46 |
| 4,575,626 A | * | 3/1986 | Oinoue et al. ............ 250/201.8 |
| 5,073,041 A | | 12/1991 | Rastani .......................... 385/33 |
| 5,245,622 A | | 9/1993 | Jewell et al. .................. 372/45 |

(Continued)

FOREIGN PATENT DOCUMENTS

| | | |
|---|---|---|
| EP | 0 840 502 A2 | 5/1998 |
| WO | WO 02/052335 | 7/2002 |

OTHER PUBLICATIONS

Hessler, Tdh, et al., "Microlens Arrays with Spatial Variations of the Optical Functions," Pure and Applied Optics, Bristol, GB, vol. 6, No. 6, Nov. 1997 (pp. 673–681).

International Journal of High Speed Electronics and Systems, vol.; 5, No. 4, Dec. 1994, "High–Performance Producible Vertical–Cavity Lasers for Optical Interconnects", Morgan, pp. 65–95.

The International Society for Optical Engineering, Reprinted from Miniature and Micro–Optics and Micromechanics, vol. 1992, (1993),"Vertical Cavity Surface Emitting Lasers: The Next Generation", Robert A. Morgan, pp. 64–89.

(Continued)

*Primary Examiner*—Loha Ben
(74) *Attorney, Agent, or Firm*—Workman Nydegger

(57) ABSTRACT

The present invention provides an optical system that includes an array of opto-electronic devices, an array of micro lenses, and a fore optic. The array of opto-electronic devices lie substantially along a plane, but the fore optic has a non-planar focal field. To compensate for the non-planar focal field of the fore optic, each opto-electronic device has a corresponding micro lens. Each micro lens has a focal length and/or separation distance between it and it respective opto-electronic device, which compensates for the non-planar focal field of the fore optic. The focal lengths of these lenses may differ relative to one another. As a result, light that is provided by the fore optic is reconfigured by the micro lenses having various focal lengths to be substantially focused along the plane of the array of opto-electronic devices. Various arrangements of microlenses, placing lenses on standoffs or posts, forming of optical waveguides, lens fabrication, wafer integration of micro-optics, and optical coupling are noted.

36 Claims, 28 Drawing Sheets

U.S. PATENT DOCUMENTS

| | | |
|---|---|---|
| 5,325,386 A | 6/1994 | Jewell et al. .................. 372/50 |
| 5,345,336 A | 9/1994 | Aoyama et al. ............. 359/628 |
| 5,349,394 A | 9/1994 | Freeman et al. |
| 5,401,968 A | 3/1995 | Cox .......................... 250/353 |
| 5,439,621 A | 8/1995 | Hoopman |
| 5,493,143 A | 2/1996 | Hokari ........................ 257/432 |
| 5,498,444 A | 3/1996 | Hayes ......................... 427/162 |
| 5,526,182 A | 6/1996 | Jewell et al. ............... 359/621 |
| 5,633,527 A | 5/1997 | Lear ............................ 257/432 |
| 5,633,724 A | 5/1997 | King et al. .................. 356/445 |
| 5,707,684 A | 1/1998 | Hayes et al. |
| 5,812,581 A | 9/1998 | Cox ............................. 372/50 |
| 5,877,040 A | 3/1999 | Park et al. ..................... 438/70 |
| 5,880,474 A | 3/1999 | Norton et al. ............ 250/458.1 |
| 5,902,997 A | 5/1999 | Kropp ......................... 250/216 |
| 5,966,399 A | 10/1999 | Jiang et al. ..................... 372/96 |
| 6,021,003 A | 2/2000 | Katsuki et al. |
| 6,040,591 A * | 3/2000 | Otsuka ........................ 257/232 |
| 6,043,481 A | 3/2000 | Tan et al. .................... 250/216 |
| 6,056,448 A | 5/2000 | Sauter et al. .................. 385/92 |
| 6,062,476 A | 5/2000 | Stern et al. ............ 235/462.35 |
| 6,073,851 A | 6/2000 | Olmstead et al. |
| 6,246,530 B1 | 6/2001 | Matsuura ..................... 359/719 |
| 6,301,363 B1 | 10/2001 | Mowry, Jr. ................... 380/54 |
| 6,339,506 B1 | 1/2002 | Wakelin et al. |
| 6,353,502 B1 | 3/2002 | Marchant et al. |
| 6,424,404 B1 * | 7/2002 | Johnson ....................... 355/44 |
| 6,590,239 B2 * | 7/2003 | Hsiung et al. ............... 257/233 |
| 6,765,617 B1 * | 7/2004 | Tangen et al. ............... 348/340 |
| 6,777,661 B2 * | 8/2004 | Summa et al. ........... 250/208.1 |
| 2003/0011888 A1 | 1/2003 | Cox et al. |

OTHER PUBLICATIONS

Optical Enginnering, Mar. 1990, vol. 29, No. 3, "Surface–Emitting Microlasers for Photonic Switching and Interchip Connections", J.L. Jewell et al., pp. 210–214.

Honeywell, Micro–Optics Fabrication Techniques, dated prior to Dec., 2000.

Honeywell, Fast Net Concept: Distinguishing Features, dated prior to Dec., 2000.

Hessler, T., "Microlens array with spatial variation of the optical functions", article, Pure Applied Optics, vol. 6, 1997, XP–00221449, pp. 673–681.

Strzelecka, E. et al., "Parallel Free–Space Optical Interconnect Based on Arrays of Vertical–Cavity Lasers and Detectors with Monolithic Microlenses", Applied Optics, v. 37(14), May 10, 1998, pp. 2811–2821. Copyright 1998 Optical Society of America.

* cited by examiner

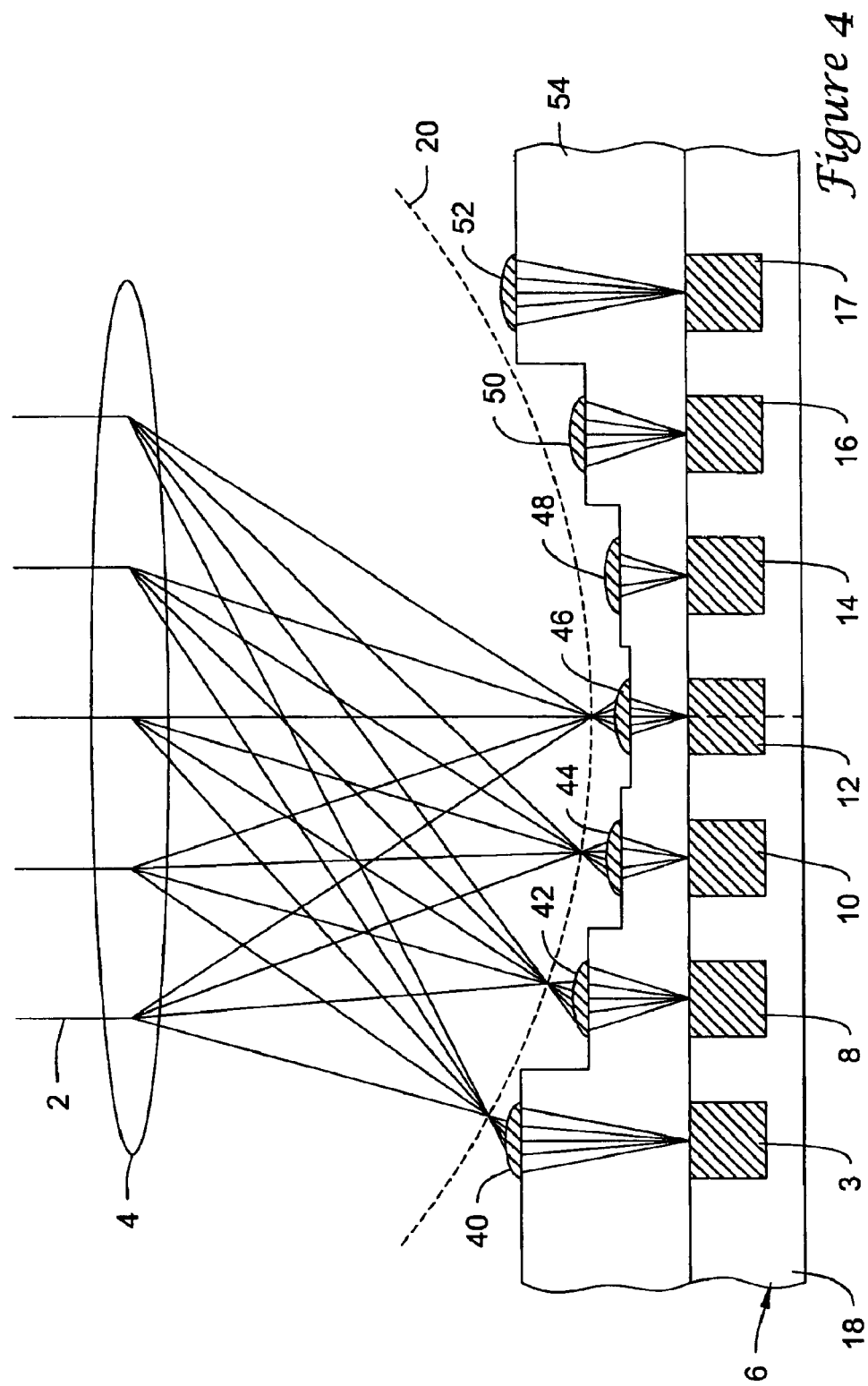

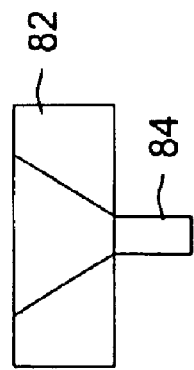
*Figure 8A*
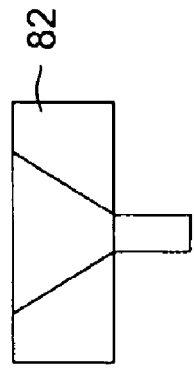
*Figure 8B*
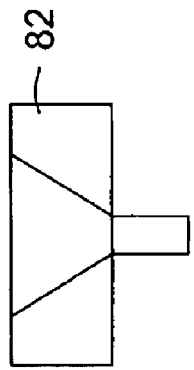
*Figure 8C*
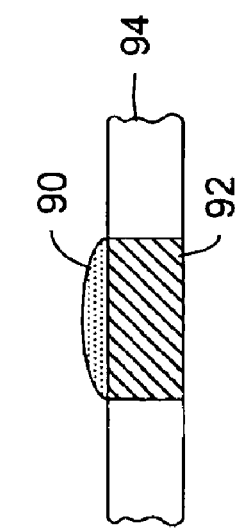
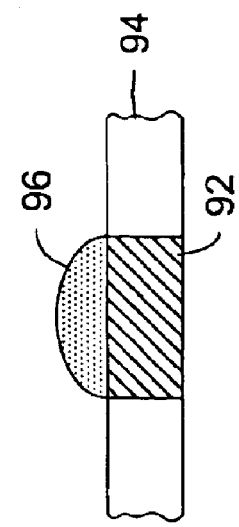
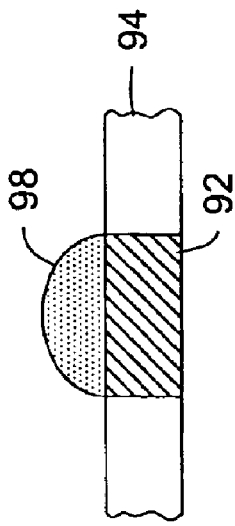

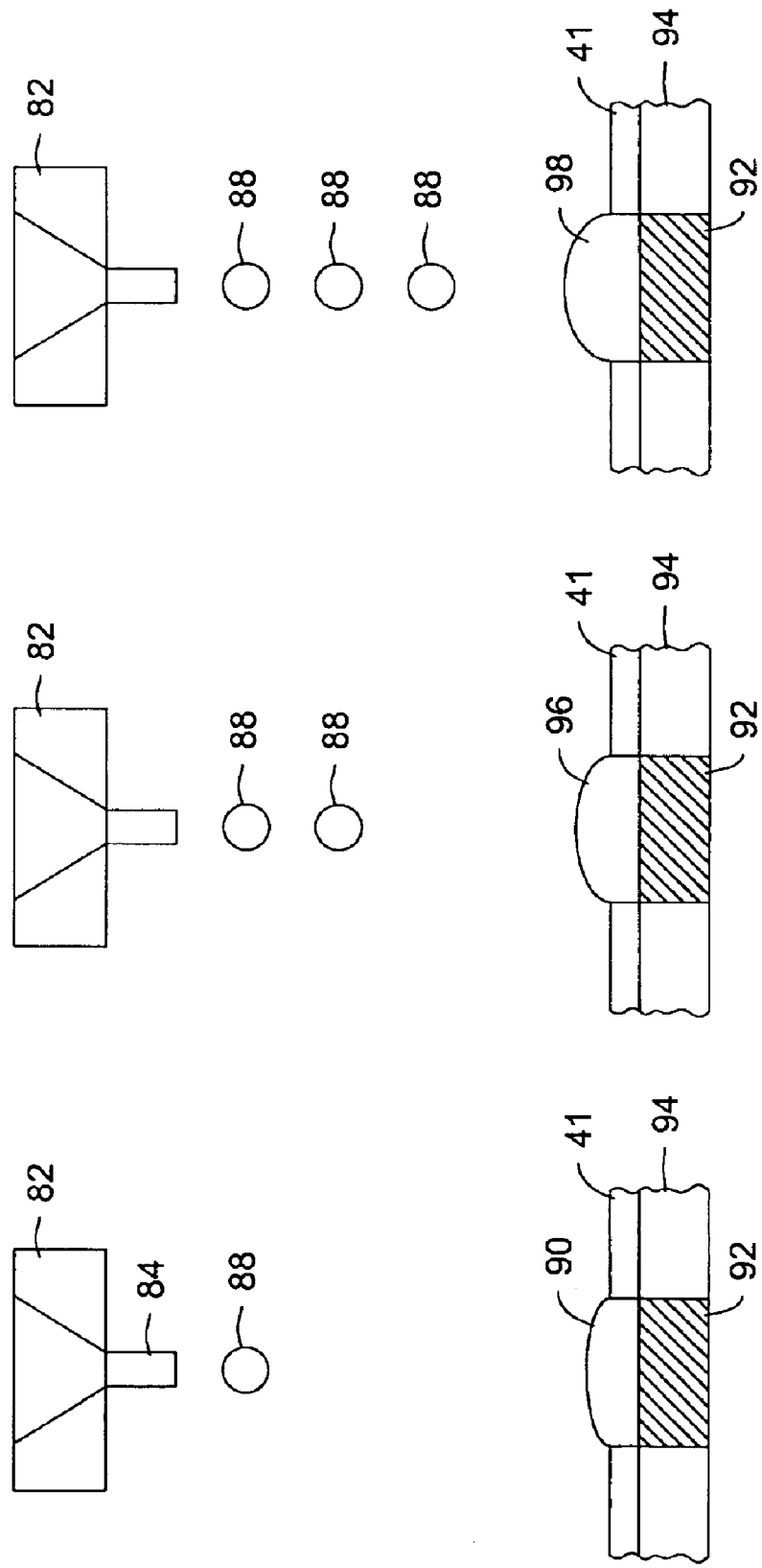

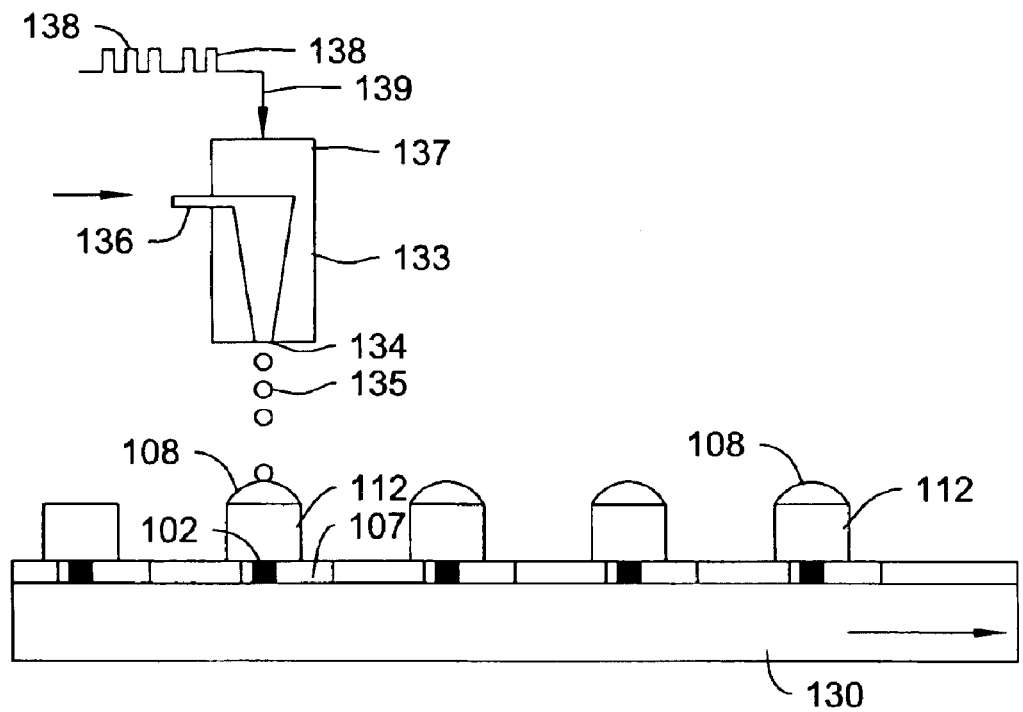

Figure 13

| 1 | plasma cleaned 10 minutes | | | | | |
|---|---|---|---|---|---|---|
| 2 | clean syringe, squizz out bubbles and blow the nozzle | | | | | |
| 3 | dispense SU-8 at center of wafer squizz into epoxy pile at 0 spin speed, 3 ml (9 mm) | | | | | |
| 4 | spin @ 0.5krpm/2s | | | | | |
| 5 | spin @ 1.5krpm/2s | | | | | |
| 6 | 2.6krpm/24s | | | | | |
| 7 | spin @ 1.9krpm/1s | | | | | |
| 8 | spin @ 1.6krpm/1s | | | | | |
| 9 | spin @ 1.3krpm/1s | | | | | |
| 10 | 15 sec rinse at 0.7krpm | | | | | |
| 11 | 16 sec 1.3krpm, wash with acetone on edge 5sec | | | | | |
| 12 | soft bake at 65C for 5 min on hot plate | | | | | |
| 13 | soft bake at 95C for 60 min on hot plate | | | | | |
| 14 | gradually cool down on hot plate to 50C about 40 min | | | | | |
| 15 | wash with acetone at 2.0krpm at wafer edge and clean the backside | | | | | |
| 16 | exposure 750 mJ/cm2 on MA6 with low vac contact wec | | | | | |
| 17 | PEB at 70C for 90 min | | | | | |
| 18 | developed in SU-8 developer for 14 min with pippet | | | | | |
| 19 | acetone, isopropanol and water wash, and followed by air blow | | | | | |
| 20 | take wafer off from carrier on hot plate at 110C | | | | | |
| 21 | wash on the back with acetone | | | | | |

Figure 14

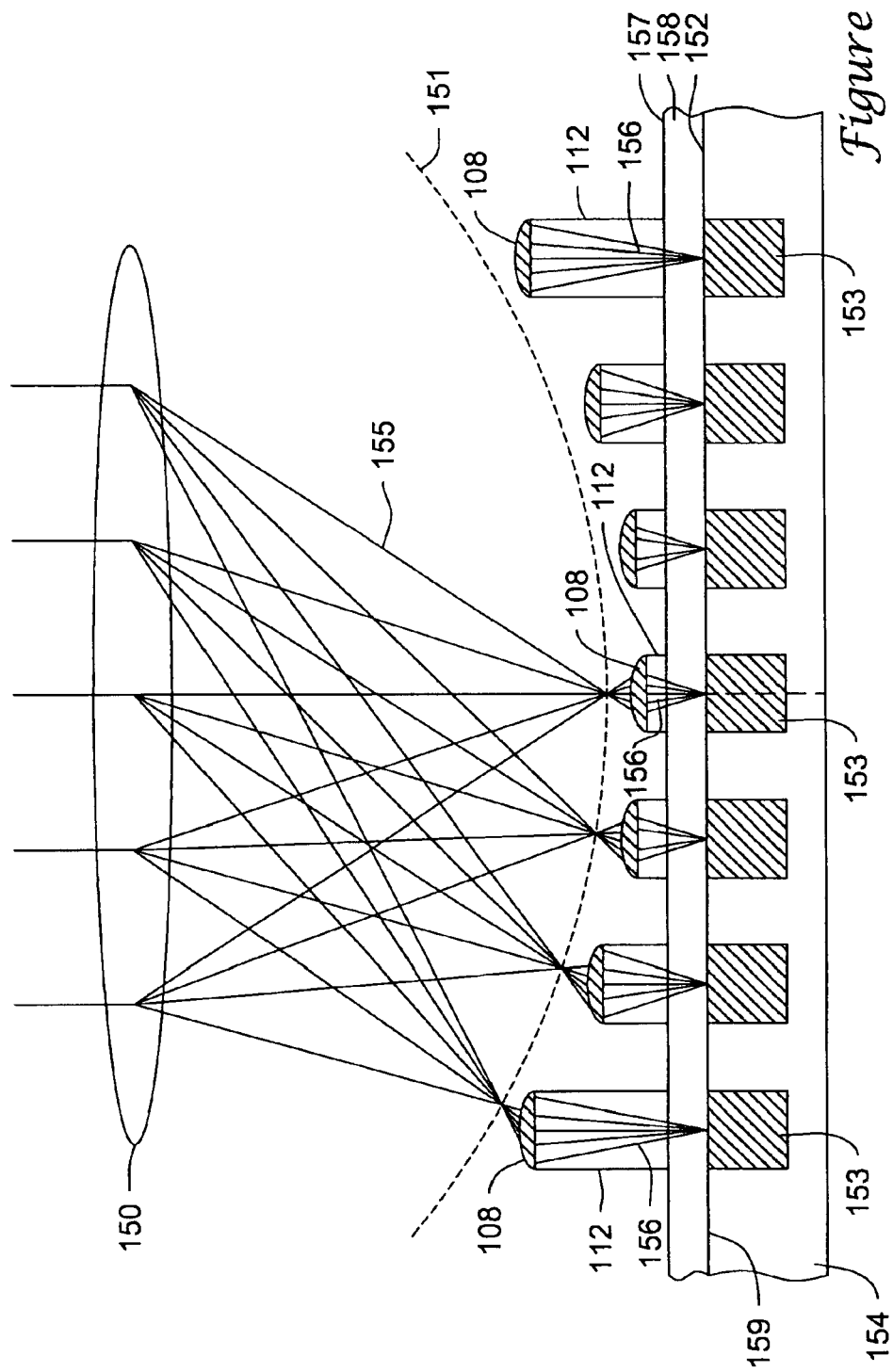

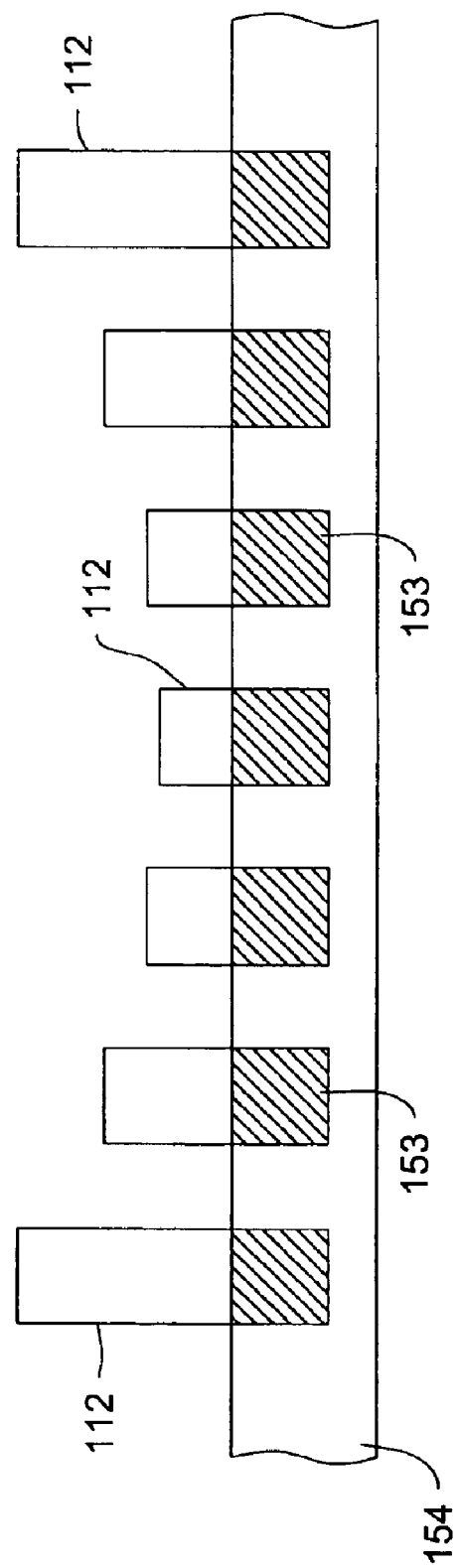

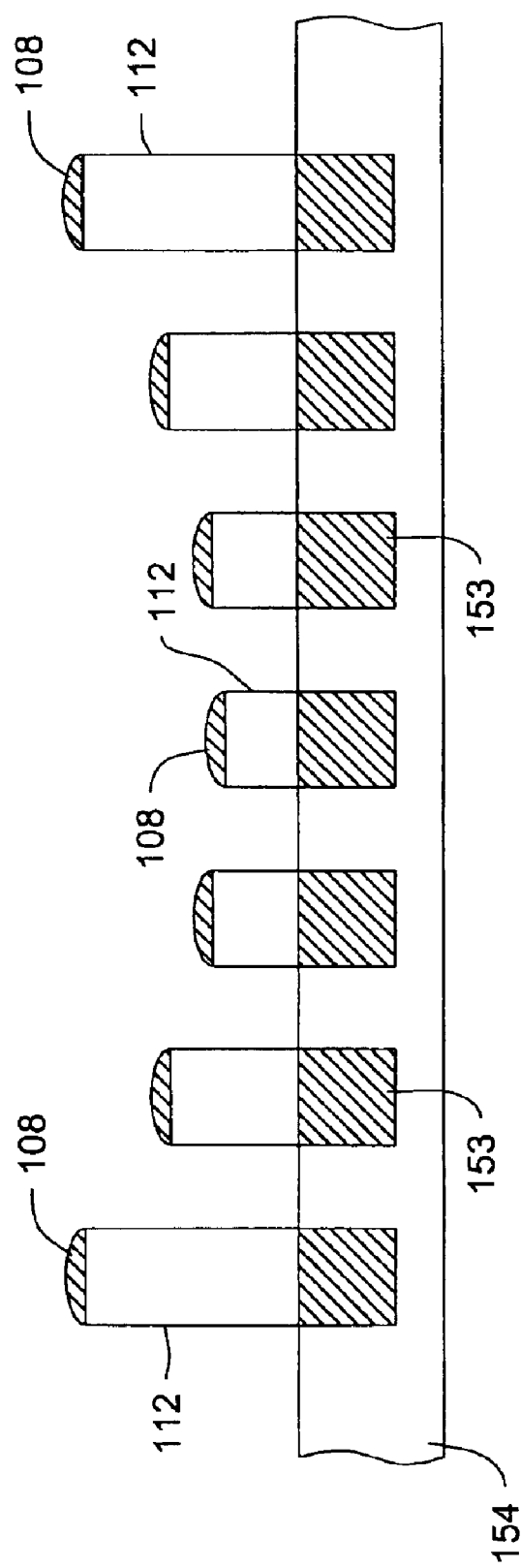

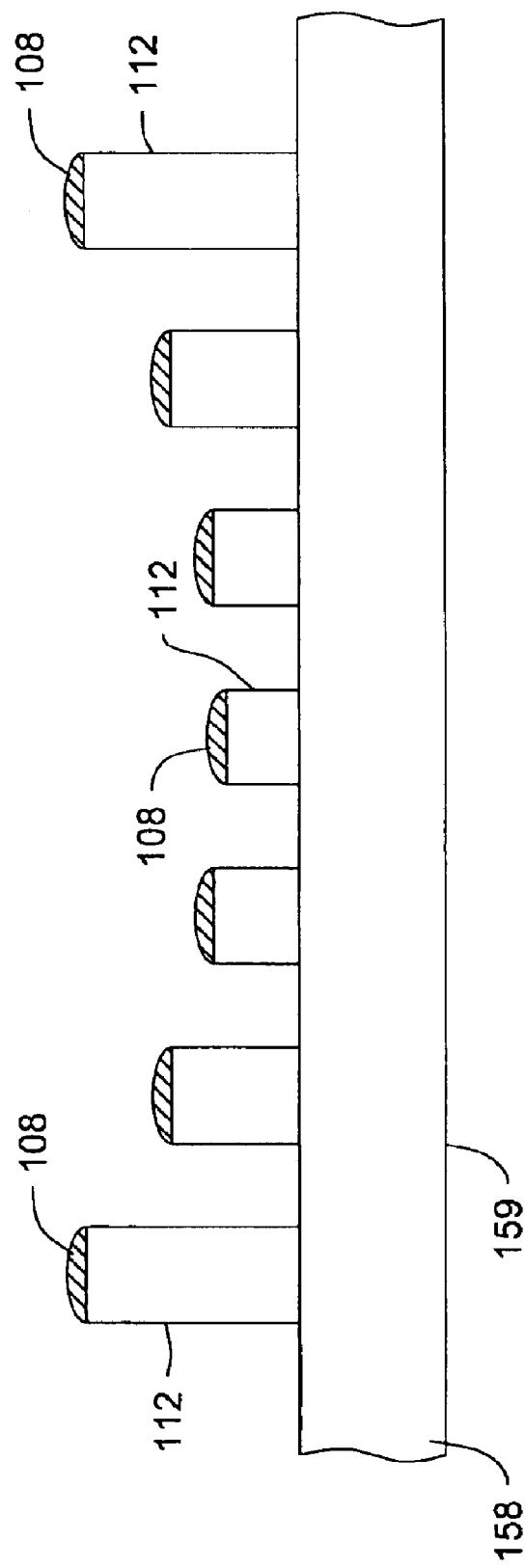

WAFER INTEGRATION OF MICRO-OPTICS

This application claims the benefit of and is a continuation-in-part of U.S. Nonprovisional Application Ser. No. 09/749,296, filed Dec. 27, 2000, and entitled "Variable Focal Length Micro Lens Array Field Curvature Corrector", now U.S. Pat. No. 6,556,349.

BACKGROUND

This invention relates to the field of opto-electronic devices and more particularly to opto-electronic devices with optical micro lenses.

Opto-electronic devices include both emitters and detectors. An opto-electronic emitter is a device that converts an electrical signal into an optical signal. Examples of opto-electronic emitters include light emitting diodes (LEDs) and vertical cavity surface emitting lasers (VCSELs). An opto-electronic detector is a device that converts an optical signal into an electrical signal. Examples of opto-electronic detectors include Charge Coupled Devices (CCDs) and resonant cavity photodetectors (RCPDs).

The development of integrated opto-electronic devices has made it possible to fabricate multiple opto-electronic devices on a single substrate to form two-dimensional arrays. These two dimensional arrays are useful in a wide variety of applications. For instance, two dimensional arrays of CCDs are often used in digital cameras and imaging equipment, while two-dimensional arrays of VCSELs and RCPDs are used for communication applications which require the switching of optical signals and the interfacing of optical signals with electronic circuits. Techniques for fabricating and using CCDs, VCSELs, LEDs, and RCPDs are well known to those skilled in the art.

When opto-electronic devices are used as arrays of emitters or detectors, a single optical element, or fore lens as it may be called, is often employed to focus or collimate the beams of light to or from the array. Unfortunately, aberrations are often associated with the fore lens. One common aberration is a curvature of field aberration, which causes the light to be focused on a curved surface, such as a sphere, rather than on the surface of a plane. Other more complex aberrations are also common. Prior art methods for compensating for field curvature include implementing a refractive field-flatting element. Unfortunately, these refractive field-flattening elements are both costly and bulky. Therefore, a need exists for an economical and compact method for reducing the curvature of field associated with the fore lens in an optical system.

SUMMARY

The present invention overcomes many of the disadvantages of the prior art by providing a method and apparatus for compensating for an aberration, such as a curvature of field or vignetting, of a fore lens in a system that includes one or more opto-electronic devices.

In one illustrative embodiment, the present invention contemplates an optical system that includes an array of opto-electronic devices that are provided substantially in a plane. The opto-electronic devices in the array may be fabricated on the same substrate or fabricated individually and then bonded or electrically connected to a substrate to form the array. The array includes a fore optic, such as a lens, provided above the array of opto-electronic devices for collimating or focusing the light traveling to or from the array. The fore optic typically has a non-planar focal field and thus focuses or collimates the light substantially along a non-planar surface, such as a sphere or other more complex image surface, rather than along the plane of the opto-electronic devices.

To compensate for the non-planar focal field of the fore optic, an illustrative embodiment of the present invention provides a micro lens for each opto-electronic device. In this embodiment, the micro lenses are may be substantially co-planar, with each micro lens having a focal length that varies in a manner necessary to relay or focus the opto-electronic device aperture onto the non-planar fore optic image surface. In one embodiment, the focal length of each micro lens depends on the location of the micro lenses relative to the optical axis of the fore optics.

In another illustrative embodiment, the micro lenses are not co-planar. Instead, each micro lens is separated from the fore optic (and thus a corresponding opto-electronic device) by a distance that depends on the location of the micro lens relative to the optical axis of the fore optic. By varying the separation distance between the micro lenses and the fore optic, more of the light that is focused on the non-planar focal field of the fore optic can be captured. In one embodiment, the separation distance between each micro lens and the fore optic is related to, and may track, the non-planar fore optic image surface. Each micro lens may also have a focal length that corresponds to the separation distance between the micro lens and the corresponding opto-electronic device so that the light captured by the micro lens can be effectively relayed or focused to the aperture of the corresponding opto-electronic device.

In one embodiment of the present invention, the array of opto-electronic devices may include opto-electronic detectors, such as p-n junction photodiodes, resonant cavity photo detectors (RCPDs), or charge coupled devices (CCDs). In another embodiment of the present invention, the array of opto-electronic devices may include opto-electronic emitters, such as vertical cavity surface emitting lasers (VCSELs) or light emitting diodes (LEDs). In yet another embodiment of the present invention, the array of opto-electronic devices may include a combination of both detectors and emitters, such as VCSELs and RCPDs.

Another illustrative embodiment of the present invention includes an optical system that has multiple opto-electronic arrays configured in a two-dimensional array on a substrate. Each opto-electronic array includes a plurality of opto-electronic devices and a corresponding fore optic provided above the opto-electronic array. Each opto-electronic array may be either centered or offset from the optical axis of the corresponding fore optic. In addition, each opto-electronic array may include emitters, detectors, or a combination of emitters and detectors.

Another illustrative embodiment of the invention includes an optical system that has an array of opto-electronic devices that are substantially provided in a plane. The opto-electronic devices in the array may be fabricated on the same substrate or fabricated individually and then bonded or electrically connected to a substrate to form the array. The array includes a fore optic, such as a lens or mirror, provided above the array of opto-electronic devices for steering, collimating or focusing the light traveling to or from the array. The fore optic typically has a non-planar focal field and thus focuses or collimates the light substantially along a non-planar surface, such as a sphere or other more complex image surface, rather than along the plane of the opto-electronic devices.

To compensate for the non-planar focal field of the fore optic, an illustrative embodiment of the present invention provides a micro lens for each opto-electronic device. In this embodiment, each of the micro lenses have a focal length that varies in a manner necessary to relay or focus the opto-electronic device aperture onto the non-planar fore optic image surface. The focal length of each lens is varied by placing the respective lens on a post situated on the corresponding opto-electronic device. The optimal focal length of each micro lens and thus the height of each post under each lens depend on the location of the micro lens relative to the optical axis of the fore optics so as to resulting in effective flattening of or compensating for the non-planar focal field.

Another illustrative embodiment of the invention may include an optical system consisting of a single discrete emitter or detector with an on-chip micro-optic, with or without a fore lens or additional imaging or focusing optic. The on chip micro-optic may focus or alternatively collimate the optical beam incident on or emitted from the chip for purposes of coupling optical energy into or out of an optical fiber or other form of optical waveguide. In a similar fashion, a one or two dimensional array of such devices may be fabricated, with each element and lens pair comprising an independent optical system for coupling into or out of an array of optical fibers or waveguides. Such a coupling arrangement may be permanent, or alternatively incorporated into a separable connectorized assembly for multiple mates and de-mates. When suitably designed, the chip-level micro-optic may be utilized to control and/or modify the fiber or waveguide modal launch condition, i.e., the relative distribution of launched optical power across all guided or unguided electromagnetic modes.

Various arrangements of microlens, placing lenses on standoffs or posts, forming of optical waveguides, lens fabrication, wafer integration of micro-optics, and optical coupling are noted.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 4 is a cross-sectional view of another optical system in accordance with the present invention, which includes an array of non-planar micro lenses, each having a corresponding opto-electronic device;

FIGS. 8a–8c are schematic diagrams showing the fabrication of micro lenses with varying focal lengths;

FIGS. 8d–8f are diagrams of the fabrication of micro lens of various focal lengths bounded by a surface coating or relief pattern;

FIG. 13 shows an example of a specific process of micro lens fabrication;

FIG. 14 is a table of an example of a specific process for making standoffs, spacers or posts on a wafer;

FIG. 20 shows micro lenses on standoffs, posts or spacers of various heights situated on a substantially planar surface of a non-device wafer or substrate for use as a focal field flattener or planarizer;

FIGS. 21a and 21b show several steps of a process of putting micro lenses and standoffs on the VCSEL wafer in a focal field flattener; and FIGS. 22a and 22b show several steps of a process of putting micro lenses and standoffs on a substantially planar surface of a non-device wafer or substrate for use as a focal field flattener.

DESCRIPTION

Figure 1:
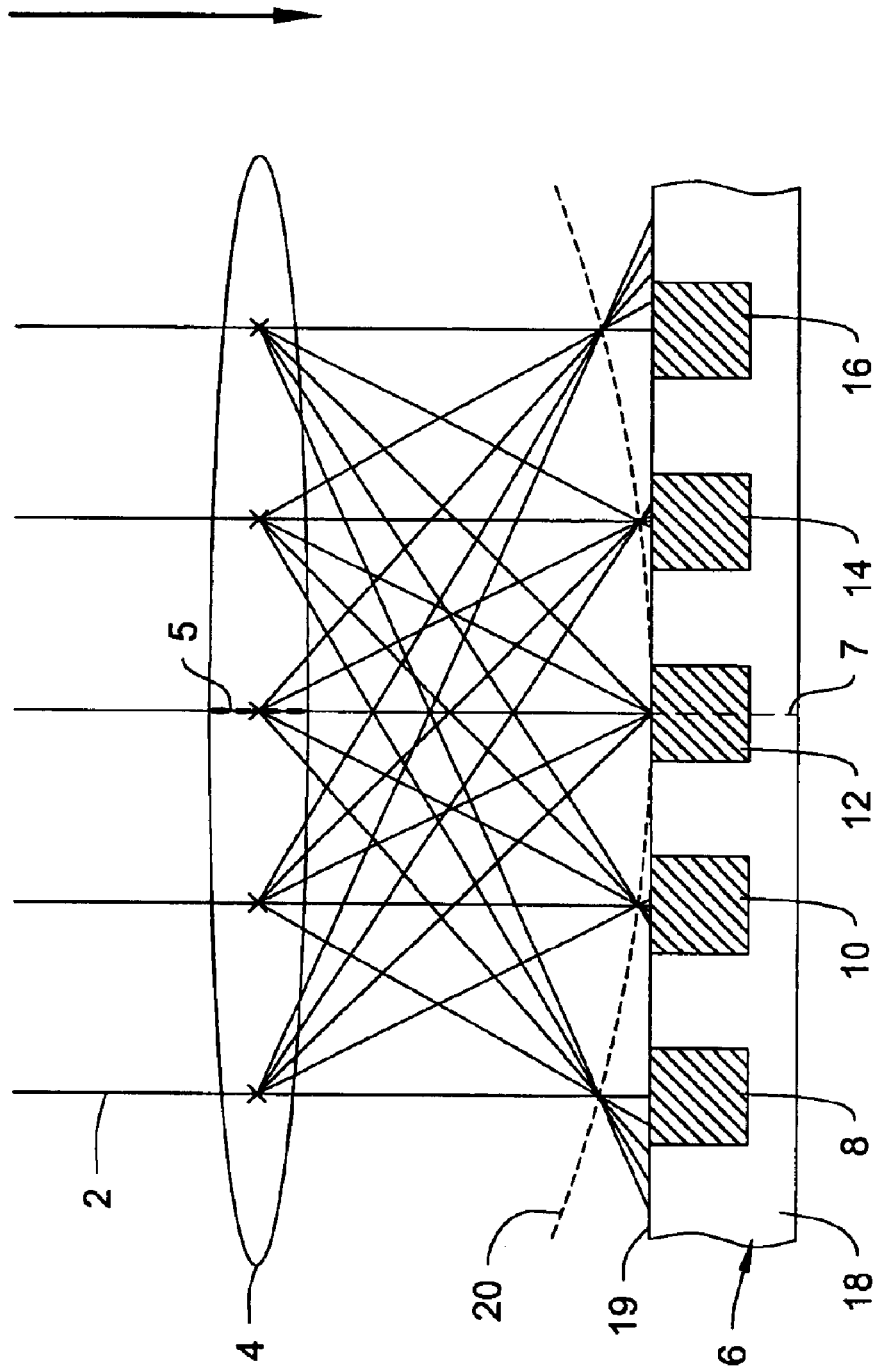
FIG. 1 is a cross-sectional view of an array of opto-electronic detectors with a fore optic provided above the array.

FIG. 1 is a cross-sectional representation of an optical system than includes a fore optic 4, such as a lens, provided above an array of opto-electronic devices 6. In FIG. 1, light rays 2 are incident on fore optic 4. Fore optic 4 transforms light 2 such that it is incident on the array of opto-electronic devices 6. The array of opto-electronic devices 6 includes a center axis 7, which may be centered or offset from optical axis 5 of fore optic 4. The array of opto-electronic devices 6 includes opto-electronic devices 8, 10, 12, 14, and 16 integrated on a common substrate 18. Substrate 18 may be a semiconductor substrate such as silicon or GaAs. Opto-electronic devices 8, 10, 12, 14, 16, and 18 may be any type of opto-electronic device known to those skilled in the art, including, for example, CCDs, RCPDs, LEDs, and VCSELs.

Fore optic 4 has optical axis 5 and a non-planar focal field, such as curvature of field 20 substantially centered along optical axis 5. As a result, light rays 2 that are incident on fore optic 4 are not focused on planar surface 19 of the array of opto-electronic devices 6. Instead, and for illustrative purposes, the curvature of field 20 has a spherical shape as shown. When the curvature of field 20 has a spherical shape, the optical signal at the opto-electronic device 12 in the center of the array of opto-electronic devices 6 may be greater than the optical signal at the opto-electronic devices 8 and 16 near the outside of the array of opto-electronic devices. While simple fore optic systems may have "spherical-like" image surfaces, more complex optical systems may have more complex image surfaces, some with both convex and concave regions. For the more complex image surfaces, the optical signal at each of the opto-electronic devices may depend on the location of the opto-electronic device relative to the particular image surface.

Figure 2:
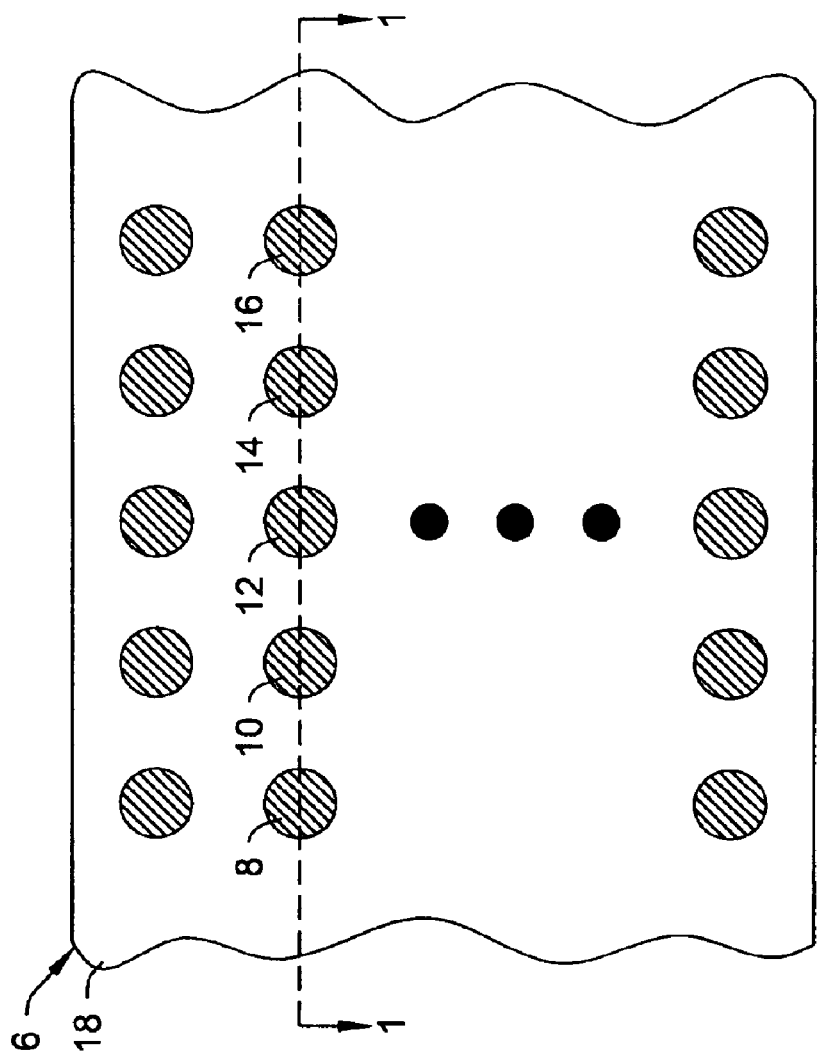
FIG. 2 is a top view of the array illustrated in FIG. 1.

FIG. 2 is a top view of an array of opto-electronic devices such as those discussed in reference to FIG. 1. Line 1—1 represents the line from which the cross-section of FIG. 1 is taken. For illustration purposes, FIG. 2 represents a square two-dimensional array. The present invention, however, is not limited to a square array. Depending on the application, the detectors can be fabricated in any suitable one or two-dimensional configuration.

Figure 3:
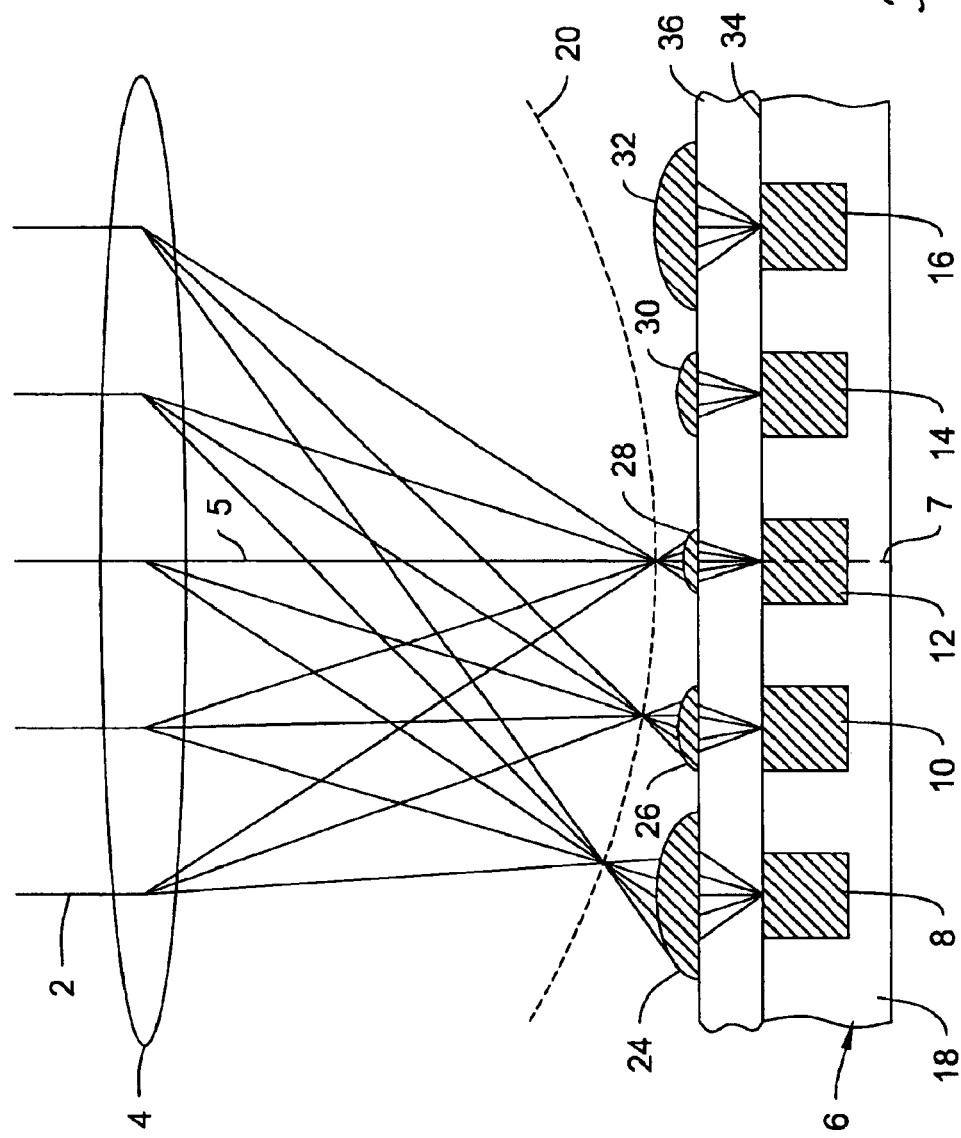
FIG. 3 is a cross-sectional view of an optical system in accordance with the present invention, which includes an array of coplanar micro lenses, each having a corresponding opto-electronic device.

FIG. 3 is a cross-sectional representation of an optical system that includes an array of opto-electronic devices in accordance with the present invention. The embodiment shown in FIG. 3 is similar to that shown in FIG. 1, except a number of co-planar micro lenses 24, 26, 28, 30, and 32 have been added above opto-electronic devices 8, 10, 12, 14, and 16, respectively. In this embodiment, the co-planar micro lenses 24, 26, 28, 30, and 32 may be initially fabricated on an optically transparent substrate 36, which is then bonded to the substrate 18 that includes the array of opto-electronic devices 8, 10, 12, 14, and 16. Fore optic 4 collimates or focuses the light rays 2 along an image surface 20 defined by the field of curvature of the fore optic 4.

Each micro lens may have a focal length that compensates for the field of curvature of the fore optic 4. When the field curvature of the fore optic 4 lies along a spherical surface 20, as shown in FIG. 2, the focal lengths of micro lenses 24, 26, 28, 30, and 32 may increase monotonically away from central optical axis 5 of fore optic 4. By varying the focal length of each micro lens, the light rays 2 that are transmitted through fore optic 4 may be substantially focused by the micro lenses 24, 26, 28, 30, and 32 to the planar surface 34 of the array of opto-electronic devices 6.

As indicated above, some simple fore optic systems may have a "spherical-like" image surface. However, more complex optical systems may have more complex image surfaces, some with both convex and concave regions. For these more complex surfaces, the optical signal at each of the opto-electronic devices may depend on the location of the opto-electronic device relative to the image surface of the fore optic. To provide compensation for fore optics that have these more complex image surfaces, the focal length of the micro lenses may not necessarily increase monotonically, but may vary according to the particular image surface of the fore optic, so that the aperture of the corresponding opto-electronic device is focused or relayed onto the fore optic image surface.

FIG. 4 is a cross-sectional view of another optical system in accordance with the present invention, which includes an array of non-planar micro lenses, each having a corresponding opto-electronic device. The embodiment shown in FIG. 4 is similar to that shown in FIG. 3, except the micro lenses 40, 42, 44, 46, 48, 50 and 52 are non-planar, and have a varying separation distance from the fore optic 4 (and thus the opto-electronic devices 3, 8, 10, 12, 14, 16, and 17 respectively). By varying the separation distance between the micro lenses 40, 42, 44, 46, 48, 50 and 52 and the fore optic 4, more of the light that is focused on the non-planar focal field 20 of the fore optic 4 can be captured by the micro lenses. Each micro lens 40, 42, 44, 46, 48, 50 and 52 may have a focal length that corresponds to the separation distance between the micro lens and the corresponding opto-electronic device so that the light captured by the micro lens can be relayed or focused at the aperture of the corresponding opto-electronic device.

The embodiment shown in FIG. 4 has the benefit of moving the micro lenses closer to the fore optic image surface, thereby capturing more of the light coming to focus at the image surface. This may permit each of the micro lenses to have substantially the same width or diameter, as shown. The embodiment shown in FIG. 3 may not necessarily permit a constant micro lens width, which may be a detriment when the width or diameter of some of the micro lenses approach or exceed the pitch of the opto-electronic devices.

The non-planar micro lenses 40, 42, 44, 46, 48, 50 and 52 of FIG. 4 may be initially fabricated on an optically transparent substrate 54, which is then bonded to the substrate 18 that includes the array of opto-electronic devices 3, 8, 10, 12, 14, 16 and 17. A number of methods for providing a varying separation distance between the micro lens 40, 42, 44, 46, 48, 50 and 52 and the array of opto-electronic devices 3, 8, 10, 12, 14, 16 and 17 are contemplated. Some of the methods use an additive process, such as a deposition or growth process. Other methods use a subtractive process.

Figure 5A:
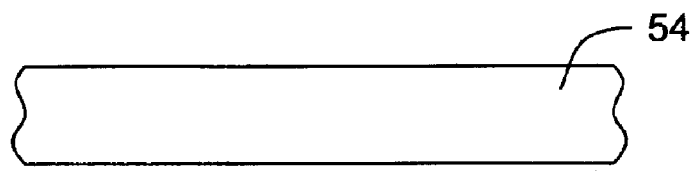
FIGS. 5a–5e are schematic diagrams showing an illustrative method for fabricating the non-planar micro lenses of FIG. 4.
Figure 5B:
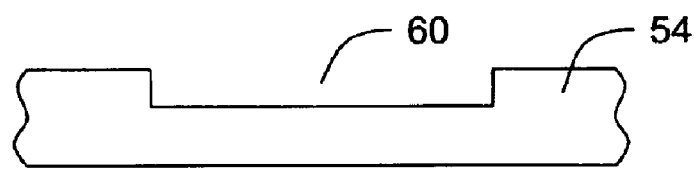
Figure 5C:
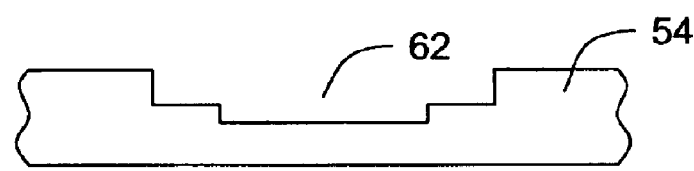
Figure 5D:
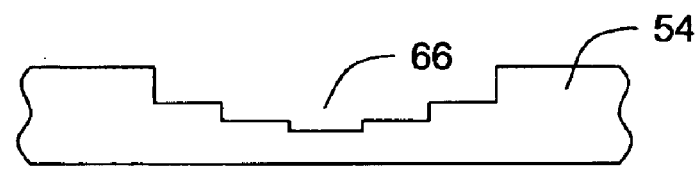
Figure 5E:
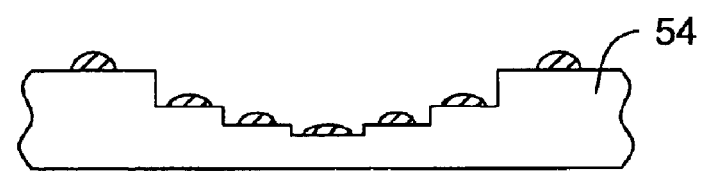

One illustrative method for providing a varying separation distance between the micro lens 40, 42, 44, 46, 48, 50 and 52 and the array of opto-electronic devices 3, 8, 10, 12, 14, 16 and 17 is shown in FIGS. 5A–5E. An optically transparent substrate 54 is provided in FIG. 5A. In FIG. 5B, a first groove or cavity 60 is etched into the top surface of substrate 54, using known methods. The first groove or cavity 60 may provide a surface for forming one or more micro lenses, as further described below. In FIG. 5c, a second groove or cavity 62 may be etched into the bottom surface of the first groove or cavity 60, as shown. The second groove or cavity 62 may provide another lower surface for forming one or more micro lenses. In FIG. 5D, a third groove or cavity 64 may be etched into the bottom surface of the second groove or cavity 62, as shown. The third groove or cavity 64 may provide yet another lower surface for forming one or more micro lenses. Finally, in FIG. 5D, a fourth groove or cavity 66 may be etched into the bottom surface of the third groove or cavity 64. The fourth groove or cavity 66 may provide another lower surface for forming one or more micro lenses. FIG. 5E shows non-planar micro lenses 40, 42, 44, 46, 48, 50 and 52 formed on the various step surfaces etched into the optically transparent substrate 54. The optically transparent substrate 54 shown in FIG. 5E can be used for providing compensation for a fore optic that has a "spherical-like" image surface.

As indicated above, however, some fore optic systems may provide more complex image surfaces. For these systems, it is contemplated that the various steps or surfaces formed in the optically transparent substrate 54, such as shown in FIGS. 5A–5E, may be tailored to provide a suitable separation distance for each micro lens that helps compensate for the non-planar and more complex image surfaces.

It is important to note that the array of opto-electronic devices illustrated in FIGS. 3–4 is not limited to either opto-electronic emitters or opto-electronic detectors exclusively. The optical system can easily be modified to include both emitters and detectors in a single array. One method used to fabricate emitters and detectors is illustrated in U.S. patent application Ser. No. 08/736,803, entitled "Monolithic Vertical Cavity Surface Emitting Laser and Resonant Cavity Photodetector Transceiver," which is incorporated herein by reference. Alternatively, emitters and detectors fabricated separately may be physically and electronically connected to a single substrate. Methods for connecting independent devices on a single substrate may include wire bonding, bump technology, or the like.

Figure 6:
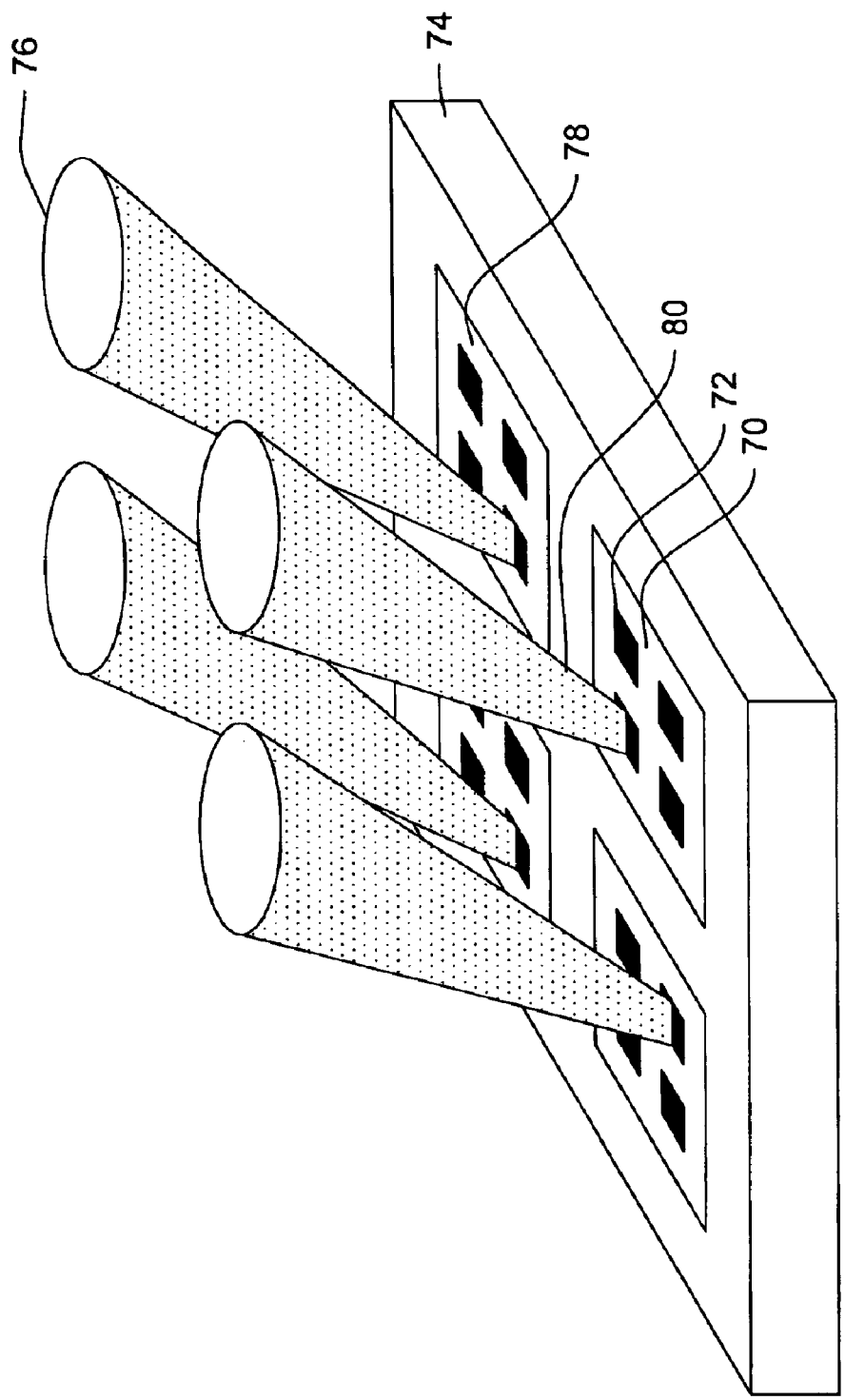
FIG. 6 is a perspective view of yet another optical system of the present invention.

FIG. 6 is a perspective view of yet another optical system of the present invention. In FIG. 6, multiple opto-electronic arrays 70 are provided in a two-dimensional configuration on substrate 74. Each opto-electronic array 70 includes a plurality of opto-electronic devices and a corresponding fore optic 76. Each opto-electronic device 72 in opto-electronic array 70 has a corresponding micro lens (not shown). Each fore optic 76 may have a non-planar focal field, such as a curvature of field. As discussed above with reference to FIGS. 3 and 4, each micro lens can be fabricated to have a corresponding focal length and/or separation distance that compensates for the non-planar focal field of fore optic 76.

In FIG. 6, there are four opto-electronic arrays each including four opto-electronic devices. FIG. 6 is merely illustrative however, and the present invention is not limited to the number or type of arrays and devices shown therein. In any event, multiple opto-electronic arrays 70 may be fabricated on a single substrate, such as substrate 74. Substrate 74 may be a semiconductor substrate such as a silicon or gallium arsenide wafer. Alternatively, opto-electronic arrays may be fabricated on an individual substrate 78 that is in turn physically bonded to or electronically connected to substrate 74. An electronic connection to substrate 74 may be provided through the use of bonding technology well known to those skilled in the art, such as wire bonding, bump technology, or the like.

Each opto-electronic array 70 may contain opto-electronic emitters, such as VCSELs or LEDs, opto-electronic detectors, such as RCPDs or CCDs, or a combination of detectors and emitters, such as VCSELs and RCPDs. Therefore, fore optic 76 may provide light 80 both to and/or from opto-electronic array 70. Light 80 provided to fore optic 76 from opto-electronic array 70 may be in turn provided to another optical device (not shown) such as a mirror, lens, optical fiber, or optical detector. Alternatively, light 80 may be provided through fore optic 76 to opto-electronic device 72, for example, from an optical device such as a mirror, lens, optical fiber, or optical emitter.

Figure 7A:
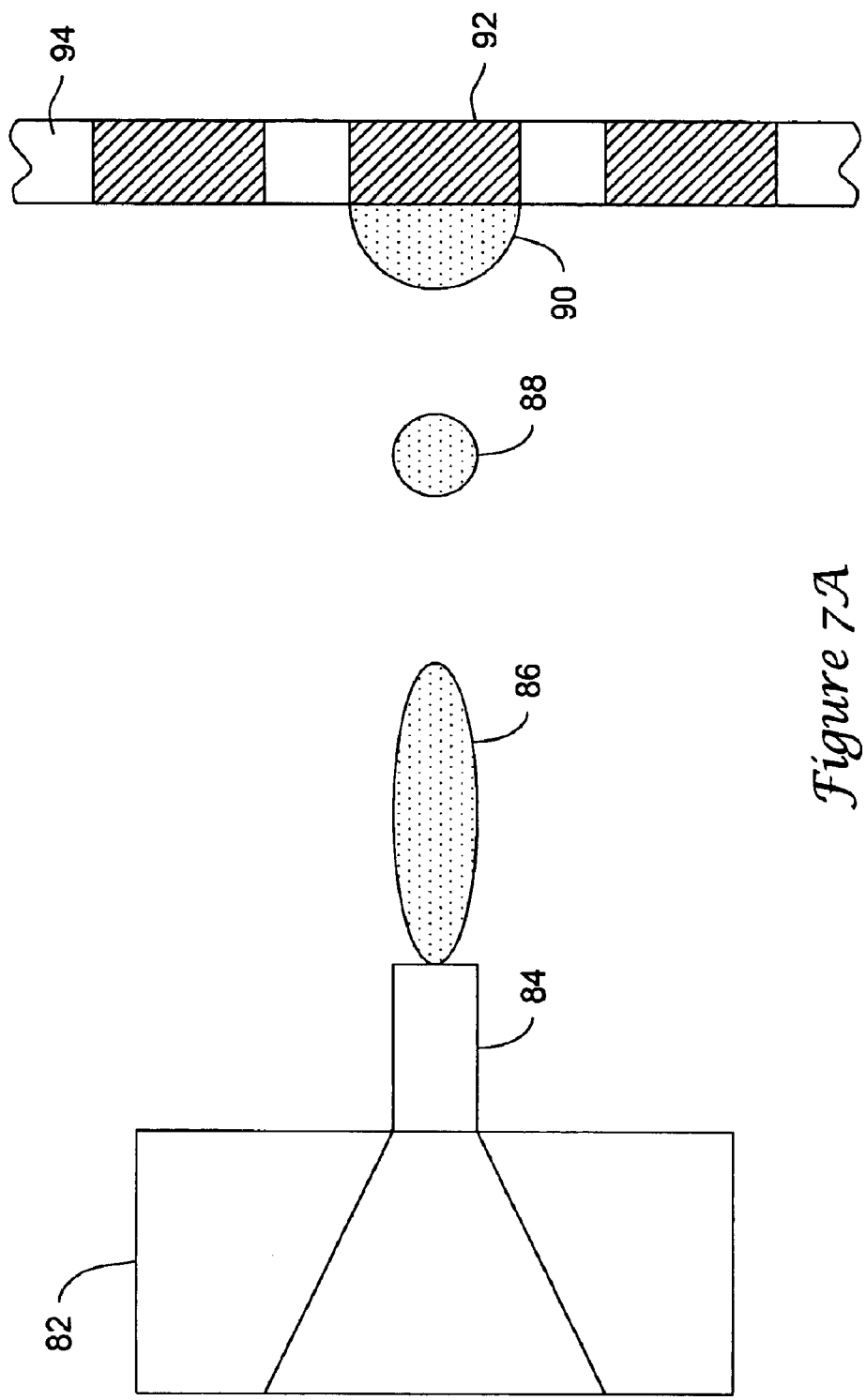
FIG. 7a is a schematic diagram of an illustrative fabrication process for forming the micro lenses.

FIG. 7a is a schematic representation of one method for fabricating the micro lenses used in accordance with the present invention. A print head 82 provides a liquid optical polymer 86 via a nozzle 84. The liquid optical polymer 86 forms a droplet 88, which is provided to an opto-electronic device 92 on a substrate 94 to form a micro lens 90.

While this illustrative method shows the micro lens 90 provided directly on the opto-electronic device 92, it is contemplated that the micro lens may be formed on another optical transparent substrate, which is then mounted or otherwise attached to the substrate 94 so the micro lenses are in registration with the opto-electronic devices, such as device 92.

Figure 7B:
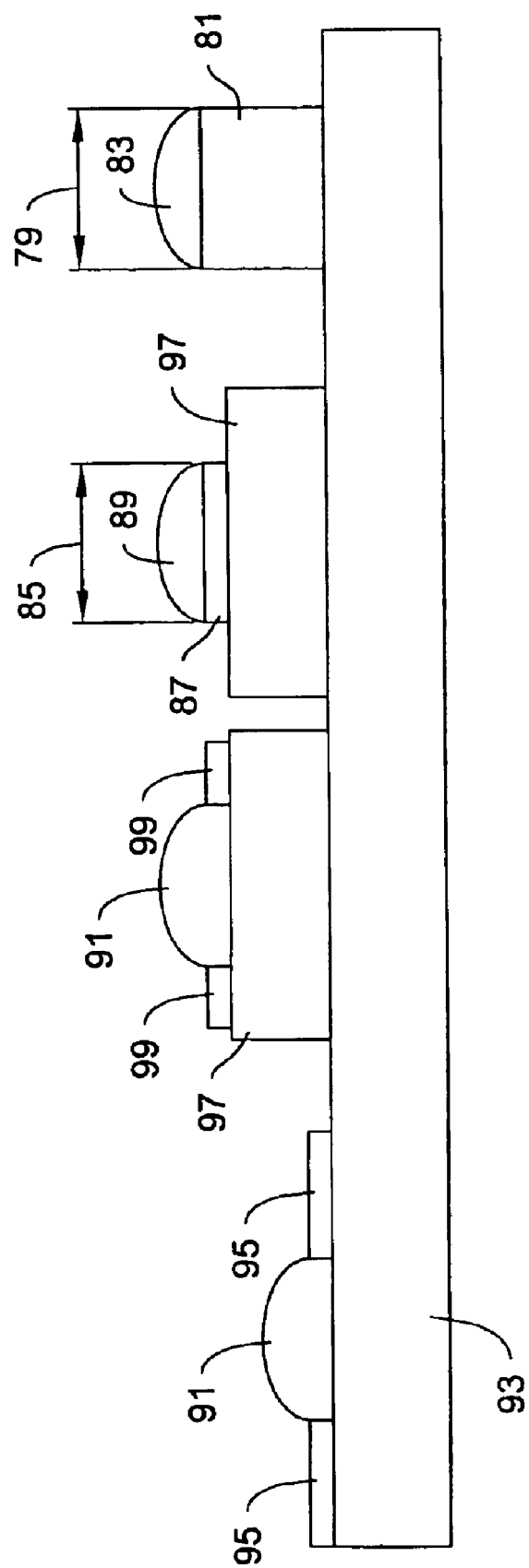
FIG. 7b shows various configurations of an optical element on a substrate.

The diameter or perimeter of a resultant micro-optical elements 89, 90, and 91, in FIGS. 7a and 7b, may be controlled, if so desired, through modifications to the surface relief or surface energy of the surface onto which the lens is to be deposited, through patterned additive or subtractive surface treatments such as etching, milling, plasma treatment, deposition of hydrophobic coatings or hydrophilic coatings, or sputter, e-beam, chemical or vapor depositions, or similar means of depositing additional materials to the surface of the substrate for the purpose of controlling the geometry of the formed optical element. The periphery of the optical element need not be constrained to a circular shape, but may be any arbitrary shape with an arbitrary number or sides, chords, or arcs. FIG. 7b shows various settings for optical element or lens 91 as it is formed on substrate 93. A surface relief or coating 95, 99, 87 may be situated around or under element or lens 89, 90, or 91. Either relief or coating 95, 99, 87 and lens 89, 90, 91 may be placed on substrate 93 or standoff 97. Post or standoff 97 may be placed on substrate 93. Optical element 91 with a surface relief or coating 99 around element 91 may be situated or formed on a post 97. Post 97 has an area that may be larger or extend beyond the base of element 91.

An optical element or lens 89 may be situated or formed on a surface relief or coating 87 which is situated on post or standoff 97. Relief or coating 87 may have the same dimension or diameter 85 as the base of element 89. A post 81 may be placed or formed on substrate 93. An optical element or lens 83 may be situated or formed on post 81. Standoff or post 81 may have the same dimension or diameter 79 as the base of element 83.

In the case where a hydrophobic coating is advantageous, materials such as Cyclotene™, Teflon™ AF, and Fluoropel™ may be used. The patterning of the material may be through utilization of any intrinsic photoimageable properties of the material, a liftoff process using an intermediate sacrificial layer, wet etching, or dry etching. In the preferred fabrication sequence, Fluoropel™ is deposited on the substrate via spin coating followed by a solidification bake. The cured film is then patterned in an oxygen plasma dry etch process utilizing a photoresist mask.

After formation of the lens utilizing any of the previously described processes, the Fluoropel™ may remain as a permanent structure or be removed as desired.

Figure 7C:
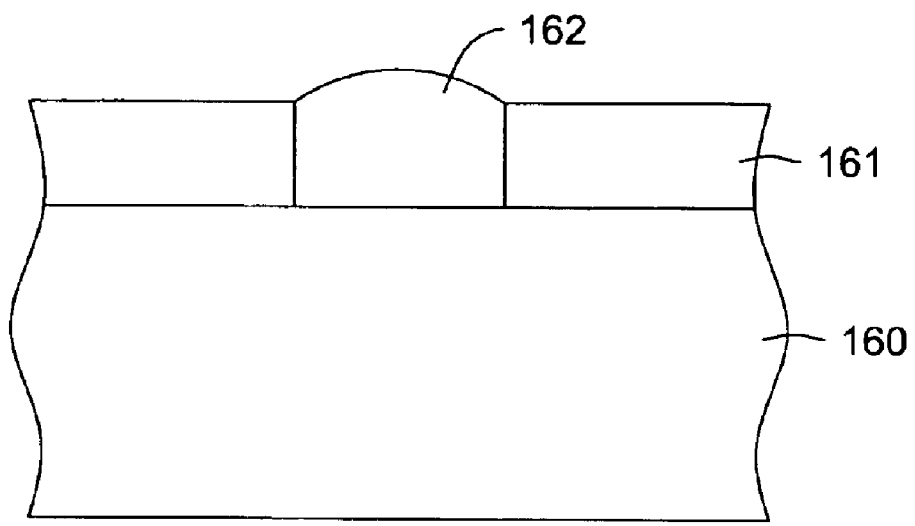
FIGS. 7c and 7d show a substrate with a surface relief layer with an opening in it that may be slightly over-filled with a material to form a convex lens or slightly under-filled to form a concave lens, respectively.
Figure 7D:
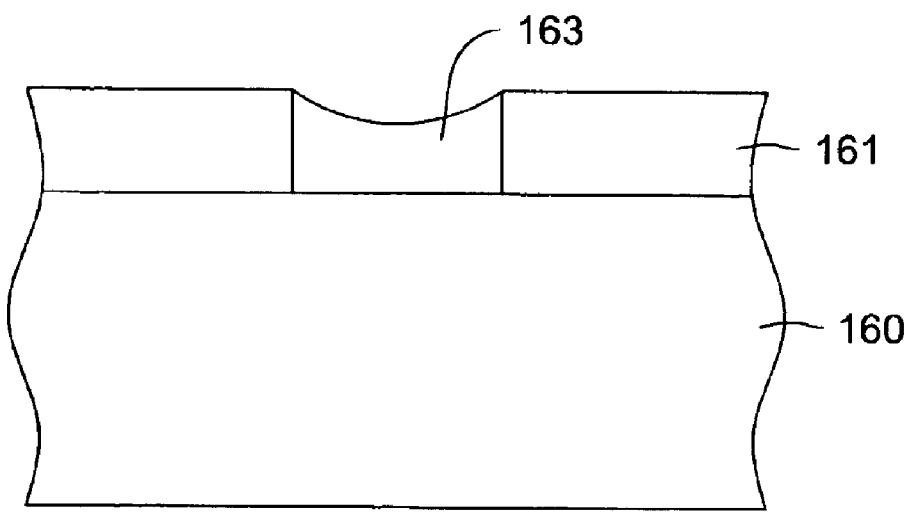

FIG. 7c shows a substrate 160 with a surface relief layer 161. A material may be slightly over-filled in an opening in surface relief layer 161 to form a convex lens 162. FIG. 7d also shows substrate 160 with surface relief layer 161 with an opening to form a lens 163 with a material partially filling the opening. Resultant lens 163 may have a concave surface. However, the resultant lenses may have other kinds of shapes and the openings in relief layer 161 may have various patterns. These lenses may be formed in the manner of the lenses or optical elements 91 of FIG. 7b. The shaped structures may also be achieved by taking advantage of volumetric changes in the structures due to the different shrinkage rates of the comprising materials. This effect can be achieved through the use of different materials with different shrinkage rates due to chemical composition or solvent content, or delintated or patterned regions of the same material whose shrinkage rate has been spatially modulated through exposure to optical or electrical radiation, thermal gradients, physical bombardment, chemical implantation, indiffusion, or outdiffusion, or similar patterned processes.

Figure 7E:
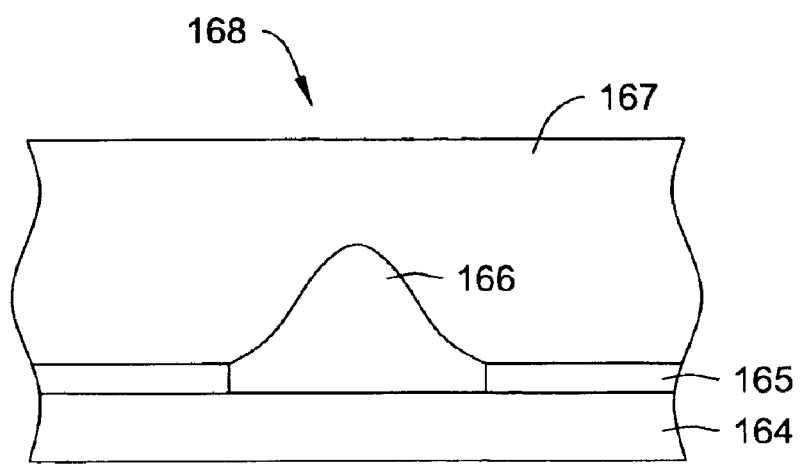
FIG. 7e reveals a formation of an optical waveguide or lens structure by the localized control of surface adhesion or surface tension.

FIG. 7e reveals the formation of an optical waveguide or lens structure by the localized control of surface adhesion or surface tension. For purposes here, a lens is merely a specialized instance of an optical waveguide, so the terms may be used interchangeably. An optical waveguide or lens may be bulk fabricated by patterning a substrate 164 with a low surface energy or low coefficient of friction material, (e.g., Teflon™). Such a material may be used for depositing or forming a layer 165 on substrate 164. The converse may also be true, i.e., utilizing a high surface energy material to enable preferential adhesion of the structural material in regions where the patterned high surface energy material remains. A portion of layer 165 may be removed depending on the application or design of the resultant device. A core material in liquid form may be applied and allowed to flow thereby forming a lens or waveguide core 166 in or on the area of a removed portion of layer 165. This technique may alternatively utilize the previously described ink-jetting process for deposition of the structural material to form the lens or waveguide.

If the material of core 166 is to be a lens, as noted in FIGS. 7b, 7c and 7d, and other Figures of this description as applicable, then a cladding 167 would not necessarily be applied and substrate 164 could instead be a substrate 93, 160 or other substrate utilized in this description. Also, in lieu of substrate 164, one may have a post or standoff for the lens 166 setting.

On top of waveguide core 166 and remaining relief layer 165, there may be formed a cladding 167 resulting in a waveguide 168. Depending on the exact processing sequence in terms or whether the core or cladding regions are formed first, the waveguide core region may be recessed into the cladding region, prior to the addition of the final optional top cladding layer. Cladding 167 may have a low index of refraction relative to that of core 166. This waveguide 168 and other waveguides formed in the above-noted manner may exhibit a low scattering loss associated with surface roughness. Large dimension cores are possible over large area substrates. These waveguides may be highly manufacturable, and the manufacturing process may be accomplished in an expeditious and fast manner.

The substrate 164 material may be glass (Precision Glass and Optics D263, for example). In addition, fused quartz, float glasses, sapphire, silicon, oxidized silicon, plastic, gallium arsenide, and indium phosphide may be potentially applicable substrate materials.

For a layer 165, the low surface energy/low friction material may be Fluoropel™, a fluropolymer from Cytonix Corporation in Maryland. Teflon™ AF, an amorphous fluoropolymer from Dupont, and Cyclotene™ benzocyclobutane from Dow Chemical has been used with some success.

The core/lens 166 material may be a UV curable polymer such as UVO-114 from EpoTek of Massachusetts. Another material may be Ultem™ thermoplastic, deposited from a liquid state after dissolution in solvent, filtering, and purification to minimize particulate matter responsible for optical scattering losses. Cytop™, a low loss fluoropolymer, and thermal and UV cure polymers such as those from Norland or EpoTek, optical adhesives, and polyimides are also suitable core/lens 166 materials. The processing of device 168 may involve forward coating, masking, etching, and stripping techniques.

Figure 7G:
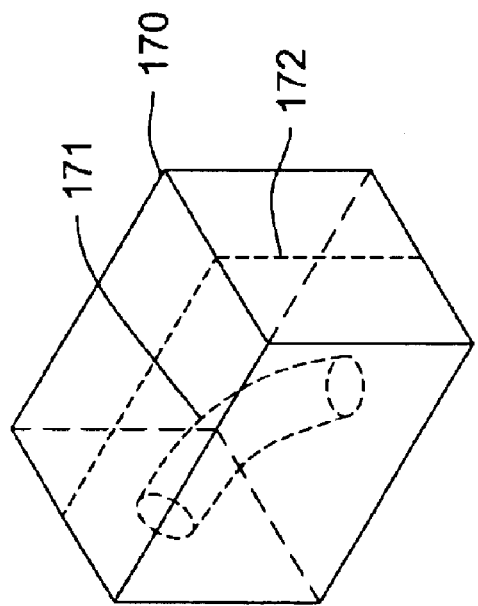
FIGS. 7f, 7g and 7h reveal a formation of optical waveguides by core injection.
Figure 7F:
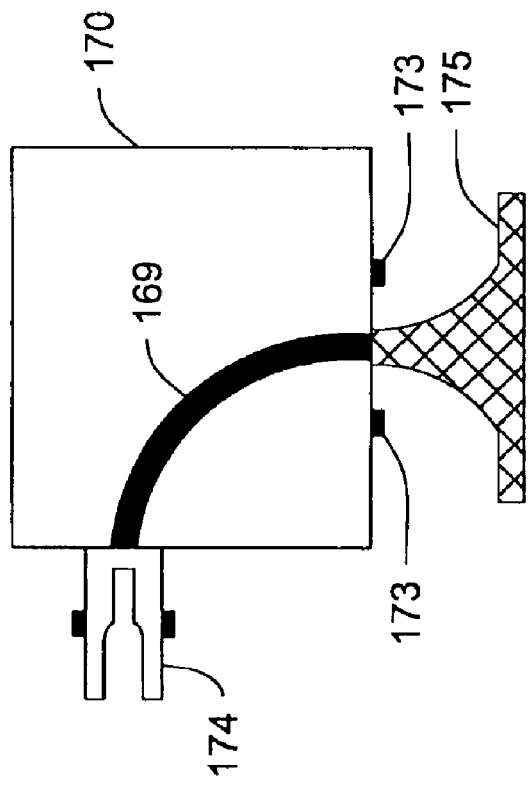
Figure 7H:
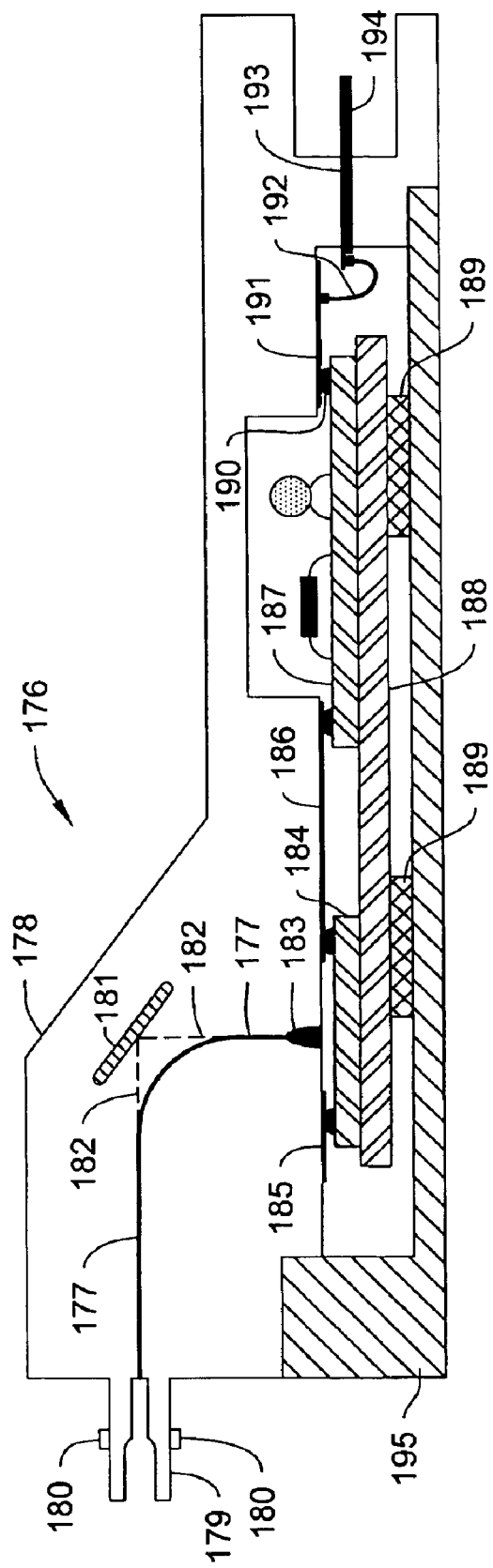

FIGS. 7f, 7g and 7h reveal a formation of optical waveguides by core injection. This technique or process may be very useful for VCSEL module and photodetector packaging, as well as optical backplane fabrication. It may also be utilized in place of waveguides or optical fibers as described, for instance, relative to FIGS. 10a, 10b and 10c. FIG. 7f shows a waveguide core 169 enclosed in a body of material 170 having a low index of refraction relative to the index of core 169. Core 169, as well as other optical waveguide components, may be fabricated by (high pressure) injection of a (possibly heated, or UV or RT curable) core material into a cast, molded or otherwise formed structure 170 with an internal channel 171 as shown in FIG. 7g. Assembly 170 may be single-part or multi-part. If structure 170 is multi-part, it may have an assembly joint 172. Structure or assembly 170 may include features such as alignment marks 173 for registration of external components or fiber/waveguide coupling devices. This approach or process may permit two or three dimensional waveguides and arrays of waveguides to be formed in a minimum of process steps. An integral fiber connector 174 may be situated and connected at the end of core 169 of structure 170. Core material inserted in channel 171 and exiting assembly 170 may form part of a removable sprue (flash) 175.

FIG. 7h shows an application of the above-described core-making technology. Device 176 may have an injection molded waveguide 177 in housing mold 178. Housing mold 178 may have a 60 μm×60 μm square or circular (or other shaped) channel into which a high index of refraction material may be injected to form core 177. The channel may be laser machined. Alternatively, the channel may be formed by casting housing 178 material around a Teflon™-coated or similar material-coated wire. Parallel channels may be formed from an array of cores or waveguides for a parallel or an array connection. The resulting waveguide array may be utilized in place of waveguides or optical fibers as described, for instance, relative to FIGS. 18a and 18b. Housing 178 may be made from low index of refraction material. The channel may be self-aligned with connector 179 which itself has align marks 180. Connector 179 may be an ST type of connector. It may be male or female. However, a female connector may work better for an optical fiber connection.

The injection molded waveguide may have a heated material, UV or RT curable material polymer resin, inlaid fiber, or other kind of material for core 177. A mirror 181 may be placed or molded in housing 178 to reflect light 182 escaping core 177 at its curve, back into core 177. Mirror 181 may be flat or curved. It may be coated with a material having light-affecting properties. The mirror approach may, for example, reduce band loss and/or vertical dimension of device 176. Light 182 may enter or exit device 176. Around an end of core 177, there may be an adiabadic flare 183. Also, there may a device 184 at that end of core 177. It may be a VCSEL or a photodetector. Device 184 may be electrically connected via a solder bump board 185 and a plated interconnect 186. There may be a driver chip 187 connected to interconnect 186. Device 184 and driver chip 187 may be situated on a heat sink 188. Heat sink 188 may be situated on deformable spacers 189 or mounts. Spacers 189 may be situated on a portion of housing 178. Device 176 may have an external electrical connection via solder bump board connection 190, plated interconnect 191, wire bond 192, feedthrough 193 and connector 194. A cover 195 may be placed on housing 178.

The molded/cast 170 material may be low refractive index, unfilled thermoplastics such as PEN, PET, PEEK, acrylic, or PMMA. The core 169 material may be a high refractive index thermoplastic such as Ultem™ which exhibits sufficiently low viscosity at elevated temperatures so as to allow injection under pressure (with minimal bubble inclusion) through an approximately 50 micron aperture waveguide core channel 171. An alternative core substance may be a thermoset material. Mirror 181 may have evaporated metal, or a polarization insensitive coating such as a hybrid semiconductor/metal/dielectric multi-layer like a silicon-platinum or titanium-zirconium dioxide. The molding piece or insert for casting/formation of waveguide core channel 171 may be a Teflon™-coated tungsten wire which could be withdrawn by pulling after molding the piecepart.

Alternatively, a two-piece assembly 170 may be formed into a single structure by pressing the two halves together at a seam 172, in the process embedding an electrically heated nichrome wire which could then subsequently be withdrawn to form a channel 171. Multiple parallel wires could be used to yield an array of channels and subsequent waveguides. After molding, the terminal faces of the waveguide facets may be mechanically polished to optical quality to facilitate the coupling of light into the structure.

FIGS. 8a, b and c are schematic representations of one method for providing micro lenses with different focal lengths across an array. In FIG. 8a, one droplet 88 is provided to an opto-electronic device 92 to form a micro lens 90. The micro lens 90 has a focal length $f_1$. In FIG. 8b, two droplets 88 are successively provided to an opto-electronic device to form a micro lens 96. The micro lens 96 has a focal length of $f_2$. In FIG. 8c, three droplets 88 are successively provided to an opto-electronic device to form a micro lens 98. The micro lens 98 has a focal length of $f_3$, where $f_3<f_2<f_1$. As the number of droplets increases, the focal length of the corresponding micro lens decreases. Therefore, the focal length of the micro lens 98 is less than the focal length of the micro lens 96, which in turn is less than the focal length of the micro lens 90. A more detailed description of one method for forming the micro lenses can be found in U.S. Pat. No. 5,707,684 to Hayes et al., entitled "Method for Producing Micro-Optical Components."

Figure 8G:
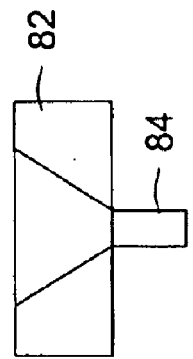
FIGS. 8g–8i are diagrams of the fabrication of micro lens of various focal lengths on surface coating or relief pattern.
Figure 8H:
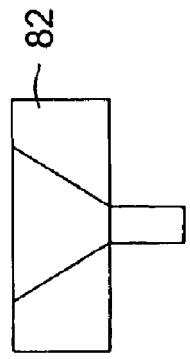
Figure 8I:
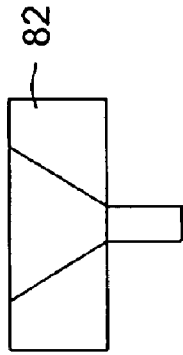

FIGS. 8d, 8e and 8f are similar to FIGS. 8a, 8b and 8c, respectively, except that FIGS. 8d, 8e and 8f include a surface coating or relief pattern 41 used to constrain the lens' outer boundary. By partially filling the opening in coating or pattern 41, a concave type of lens may be formed. Here, one has the use of both the ink jetting and substrate patterning together in the same process. FIGS. 8g, 8h and 8i show a surface coating or relief pattern 43 situated under the lens being formed with ink jetting.

Figure 9:
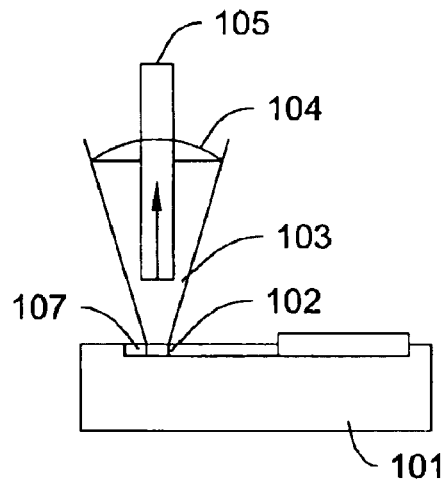
FIG. 9 shows the divergence of a VCSEL that does not have an integrated optical lens on its chip.

FIGS. 9–11 illustrate the benefit of integrating micro-lens on optoelectronics emitter, such as VCSEL, in enhancing optical power coupling into optical fibers.

Figure 10A:
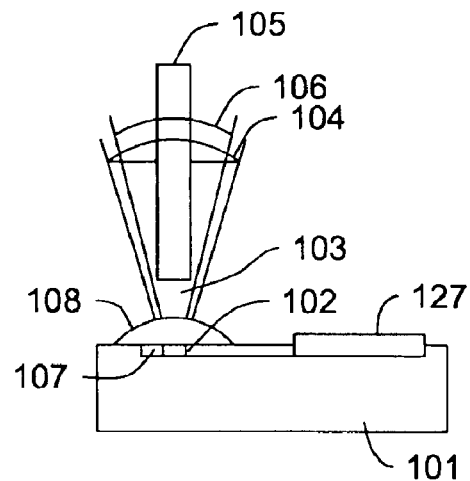
FIGS. 10a–10c show a VCSEL having a micro lens on no standoff, a micro lens on a short standoff and a micro lens on a tall standoff, respectively.

FIG. 9 shows an array chip 101 with a VCSEL 107 aperture 102 emanating light 103. Light 103 has a large divergence angle 104 and a large numerical aperture (NA) which is equaled as sin ($\theta_{div}/2$), where $\theta_{div}$ is divergence angle 104. Only a portion of light 103 enters optical fiber 105. This may be an inefficient transfer of light energy from VCSEL 107 to fiber 105. FIG. 10a shows the divergence angle 104 reduced to an angle 106 of light 103 by using a convex micro lens 108 situated on aperture 102 of VCSEL 107. However, light 103 still diverges from aperture 102 in FIG. 10a.

Figure 10B:
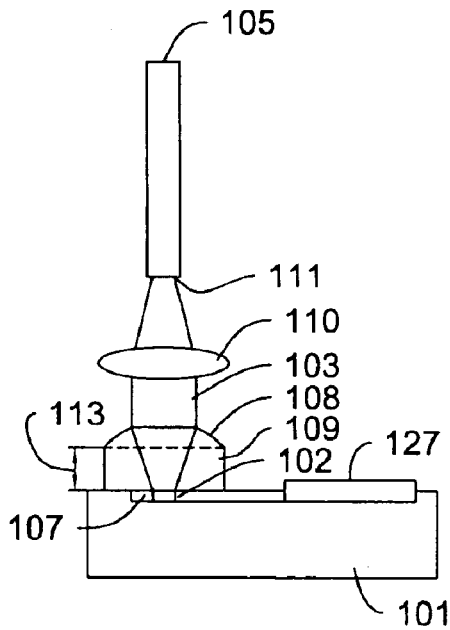

FIG. 10b shows the same VCSEL array chip 101 as in FIG. 10a. VCSEL 107 has a standoff 109 situated over its aperture 102. Standoff 109 is a cylindrical post of transparent material that conveys light 103 to lens 108. The material may be SU-8™, Riston™, PMMA or an appropriate polymer. On top of standoff 109 is micro lens 108. Standoff 109 affects the focal length of lens 108 relative to aperture 102 of VCSEL 107. Light 103 from lens 108 on standoff 109 is collimated. A lens 110 is utilized to focus light 103 to an end 111 of optical fiber 105.

Figure 10C:
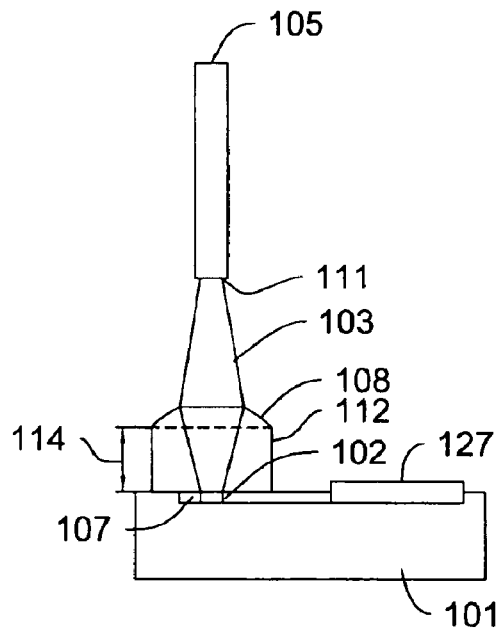

FIG. 10c shows a similar arrangement as in FIG. 10b, except FIG. 10c reveals a higher standoff 109. The physical characteristics of standoffs 109 and 112 may be the same except for their heights or lengths 113 and 114, respectively. Height 114 is greater than height 113. The focal length between aperture 102 and lens 108 is different than the focal lengths of lens 108 in FIGS. 10a and 10b. Light 103 in FIG. 10c is focused on the entry end 111 of optic fiber 105 without the need of focusing lens 110 of FIG. 10b. Item 127 is a bonding pad for VCSEL 107.

Figure 11A:
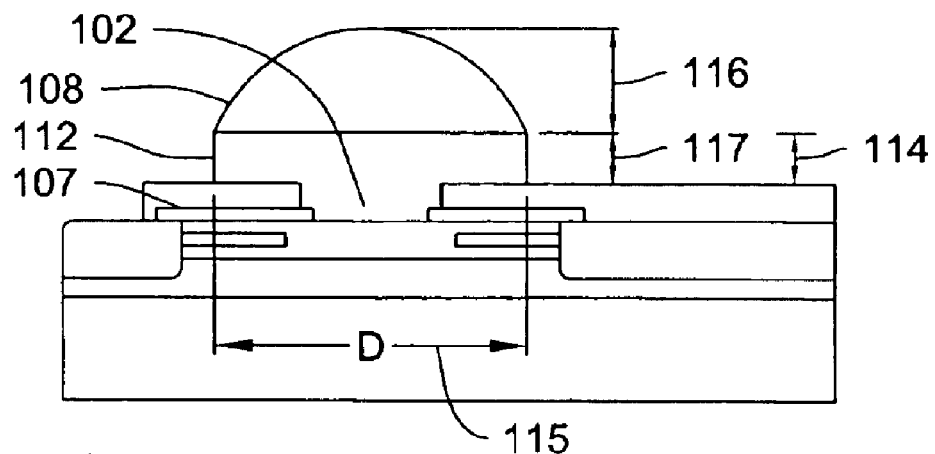
FIGS. 11a and 11b show a diagram of dimensional relationships of a micro lens and standoff on a VCSEL aperture, and a graph of numerical aperture, or divergence, of the emitting beam change as function of integrated lens sag and standoff height parameters, respectively.
Figure 11B:
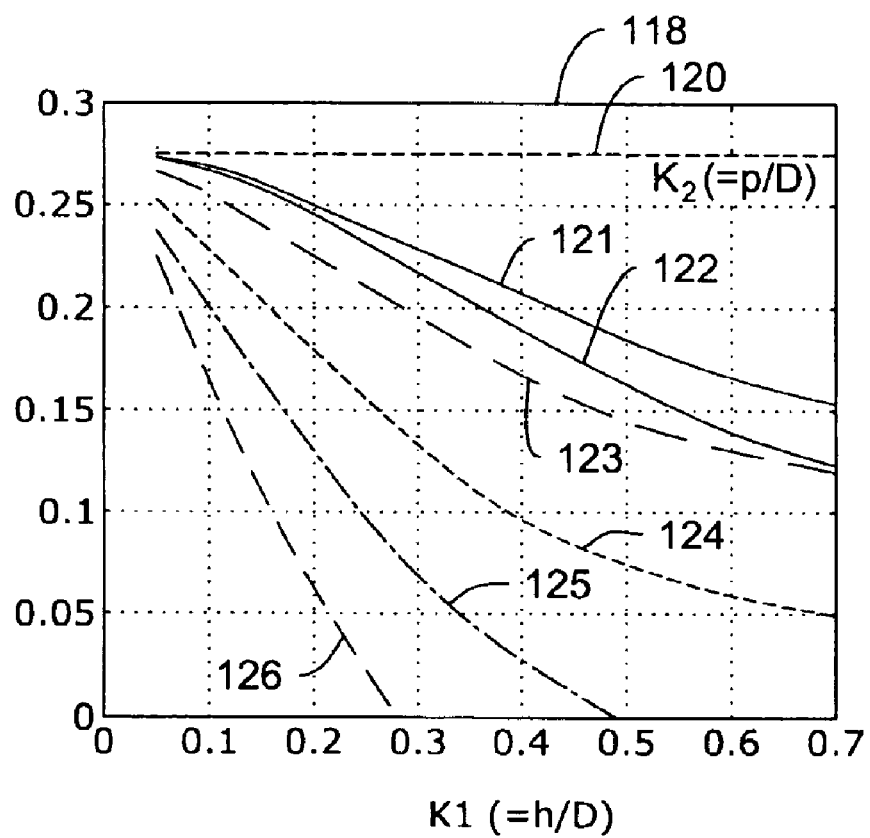

FIG. 11a is a diagram showing dimensional relationships of a micro lens 108 and standoff 112 on aperture 102 of VCSEL 107. FIG. 11b is a graph showing numerical aperture change as function of post height 114, lens 108 sag and index of refraction. Lens sag is h. "k1" is a ratio h/D, where h is a height 116 of lens 108 and D is a diameter 115 of lens 108. "k2" is a ratio p/D, where p is a height 117 of the post, spacer or standoff 112 and D is diameter 115 of standoff 112. Diameters (D) 115 of lens 108 and standoff 112 are the same in this illustrative example but could be different.

Graph 118 of FIG. 11b shows the numerical aperture (NA) of a VCSEL output beam as a function of k1 and k2 calculated using a simple ray tracing method. The index of refraction "n" is around 1.5 unless indicated otherwise in graph 118. The ordinate axis of the graph 118 represents the numerical aperture and the abscissa axis represents k1. "k1=h/D" and "k2=p/D". Line 120 represents the NA of a VCSEL without any lens or post. Line 121 is where k2=0 and n=1.55. Line 122 is where k2=0 and n=1.71. Each represents a case where the lens is integrated directly on the VCSEL without a post or standoff. Lines 123 through 126 represent the cases where convex lenses are integrated on standoffs or posts of different heights. Line 123 is where k2=0.2 and n=1.55. Line 124 is where k2=0.6 and n=1.55. Line 125 is where k2=1.0 and n=1.55. Line 126 is where k2=1.5 and n=1.55. For a given set of values k2, n and k1, one may determine the NA from graph 118. From the NA one may determine the angle of divergence $\theta_{divergence}$; $\theta_{divergence}=2$ arcsin(NA).

Figure 12A:
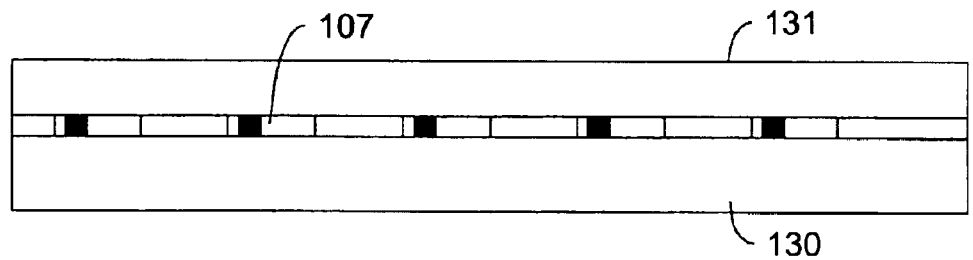
FIGS. 12a–12d reveal a process of standoff or post fabrication on a wafer, mounting of micro lenses on the standoffs or posts and dicing of the wafer, respectively.
Figure 12B:
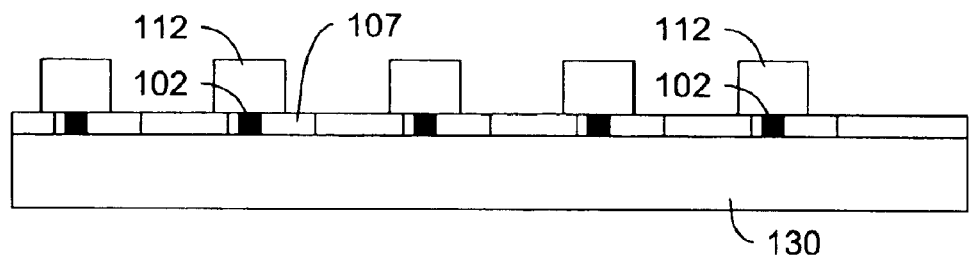
Figure 12C:
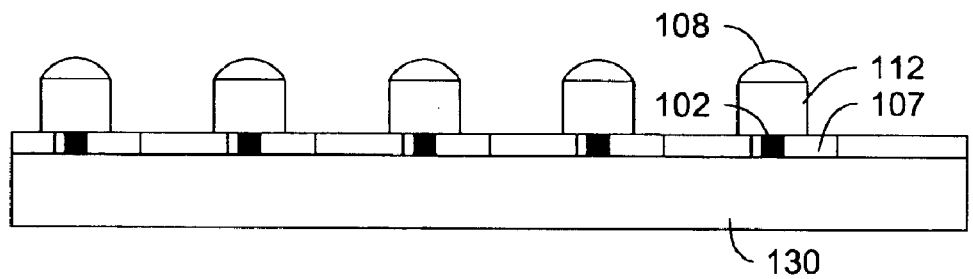
Figure 12D:
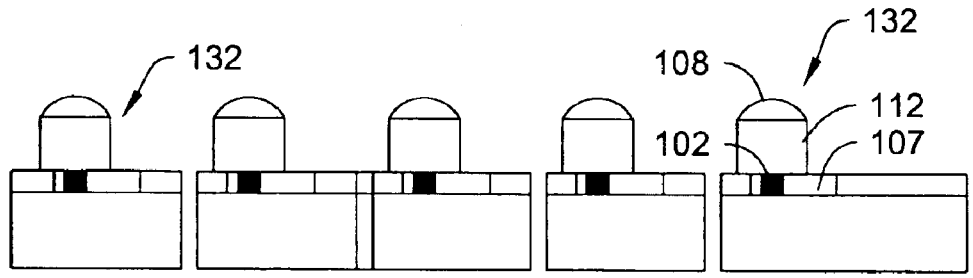

FIGS. 12a to 12d show a process for wafer-scale micro lens integration. In FIG. 12a, an array of VCSELs 107 is shown on a wafer 130. A coating of film 131 may be applied on wafer 130 and VCSELs 107. The desired material properties of film 131 include transparent, uniform, and low stress properties. Film or layer 131 is patterned with a mask for standoffs 112 using standard photolithographic processes. The uncovered material 131 is removed. The mask is also removed resulting in an array of standoffs or posts 112 on VCSELs 107 as in FIG. 12b. This process results in standoffs 112 having good alignment with the optoelectronic device 107 active apertures 102 over the entire device wafer. On standoffs or posts 112 are formed micro lenses 108, as shown in FIG. 12c. This results in an entire wafer of VCSELs 107 with focusing micro lenses 108 having standoffs 112. Wafer 130 of FIG. 12c may be then diced into chips 132, as in FIG. 12d, with a desired number and configuration of VCSELs 107 or other optic electronic devices that may be on wafer 130 with or in lieu of the VCSELs.

FIG. 13 shows one method of making lenses 108 that are put on standoffs 112. It involves a jet-printing technique for applying the material for micro lenses. A jet-print head 133 has a nozzle 134 that puts 20 to 60 micron diameter droplets 135 on a standoff 112 to form a lens 108. The fluid for the droplets enters head 133 via input 136. The timing, the number of droplets and their size are controlled via a piezo-transducer kind of valve 137 by signals 138 sent to input 139. Lens 108 may be made in a serial assembly-line fashion where substrate or wafer 130 moves from left to right in FIG. 13 as lenses 108 are formed by the jet print process. There may be a large number of jet-print lens makers operating in parallel across the wafer for fast and efficient production of lenses 108. Lenses 108 are refractive and not sensitive to wavelength variations. Lenses with varied focal length can be achieved by controlling the size and the number of droplets. An array of micro-lenses with each of its lens elements having a prescribed variation of focal length can also be achieved this method. Very fast lenses 108 may be formed on standoff 108 for emitter or detector type devices on wafer 130. One may achieve F/1 or better aperture for lenses 108. Lens arrays with good uniformity of two percent or less can be achieved utilizing this process by keeping a constant size and number of droplets.

As an alternative method to "ink jet" printing, a number of other methods can be utilized to apply the lens forming materials to patterned substrates, including dip-coating, meniscus coating, and spin coating.

FIG. 14 shows a list revealing a process flow for the post or standoff fabrication on a wafer scale. It is a process for producing wafer-scale or otherwise large-scale arrays of lens posts or standoffs using a SU-8™ photosensitive polymer. Sample substrates are first cleaned utilizing wet chemical baths or plasma treatments. After dispensing the required volume of SU-8™ on the substrate (depending on the substrate size and required film thickness), the sample is spun in the range of about 500 to 10,000 rpm in a series of sequential ramped cycles for periods of time on the order of 10 to 120 seconds each. After removal of excess material in the form of "cotton candy", back, or front side edgebeads, the sample is allowed to sit in a horizontal position to allow the film to relax and in the process remove any residual stress from the coating operation. The sample is the baked, in multiple steps or ramps, at anywhere from 20 to 150 degrees C. in a convection oven or on a hot plate to remove residual solvents and solidify the film for further processing. After exposure to ultraviolet light through a patterned contact mask or projection stepper, the sample is again baked at about 50 to 90 degrees C. for a period of time, prior to being developed in the recommended SU-8™ developer solution or solvents such as acetone, NMP, or butyrolactone.

After developing, the samples are rinsed of residual developer and dissolved SU-8™ material, dried, and exposed to a final thermal bake cycle to stabilize the material and complete the standoff formation. Depending on the requirements of the particular application, polymers other than SU-8™ may be used, such as novolac resins, PMMA, Riston™, or photosensitive epoxies. Additionally, other means of film deposition such as: dry lamination, spray coating, dip coating, meniscus coating, or brushing may be used.

Figure 15:
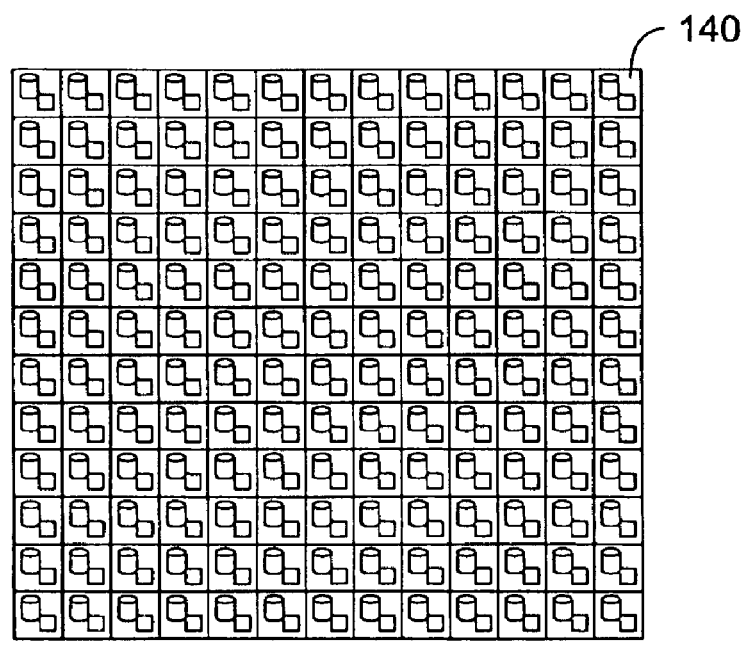
FIG. 15 shows a microphotograph of array of posts aligned to VCSEL active regions on a GaAs VCSEL wafer.
Figure 16:
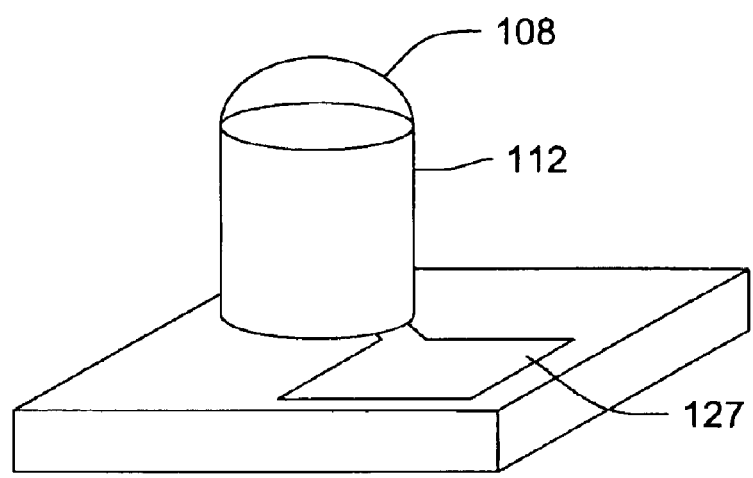
FIG. 16 is a three-dimensional perspective view of a micro lens and post on a VCSEL chip.

FIG. 15 is a microphotograph that reveals a wafer 140 having an array of opto-electronic devices with integrated standoffs 112. FIG. 16 reveals a three-dimensional perspective drawing of a standoff 112 with its micro lens 108 on a chip, and a bonding pad 127.

Figure 17A:
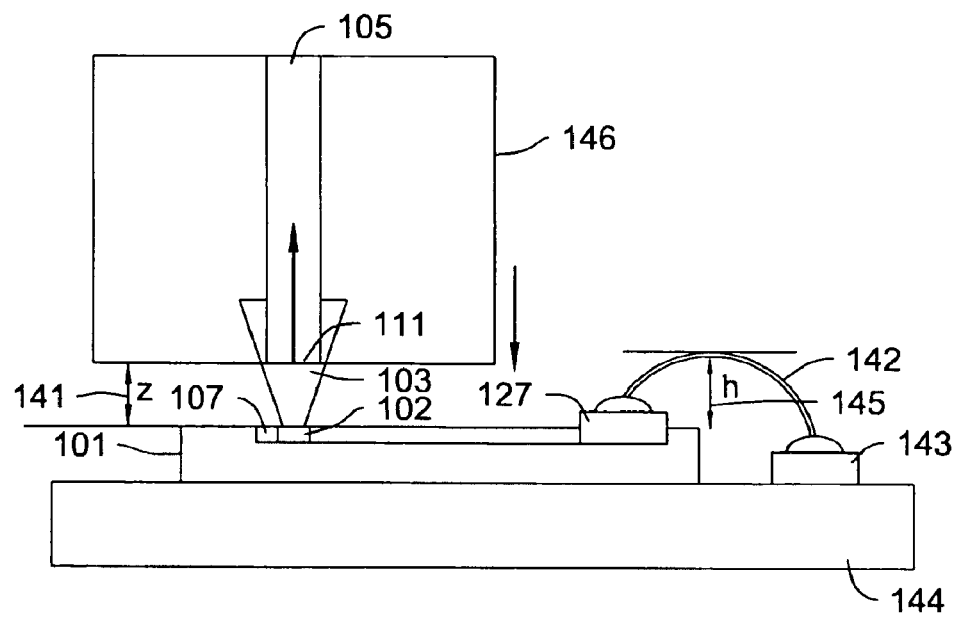
FIGS. 17a and 17b show the disadvantages of direct coupling between an optical fiber array connector to a chip of VCSELs or photo detector array, without integrated micro lenses and standoffs.
Figure 17B:
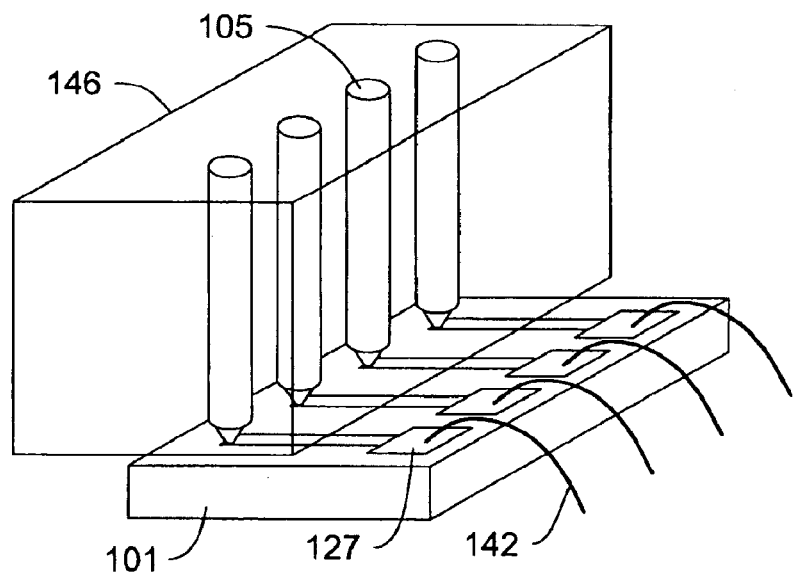

FIGS. 17a and 17b show the disadvantages of direct optical waveguide or fiber coupling to an array of VCSELs 107 or photo detectors, without micro lenses 108 and standoffs 112. To obtain a sufficient direct optical waveguide or fiber coupling, waveguide or fiber end 111 needs to be very close to aperture 102 of VCSEL 107. A distance 141 is between aperture 102 and waveguide or fiber end 111. Chip 101 is connected to an external pad or terminal via a bonding wire 142 from pad 127 on array chip 101 to pad 143 on a chip-supporting board 144. The bonding wire is a distance 145 above VCSEL 107. Distance 145 typically is greater than distance 141 and there could be an obstacle if waveguide or fiber array connector housing 146 extends over to bonding wire 142, like that in FIG. 18a. Such coupling also needs the VCSEL 107 numerical aperture to be less than the waveguide or fiber 105 numerical aperture, which is difficult for an oxide VCSEL. This layout with the close coupling may require a large VCSEL chip so that connector 146 may not be obstructed by wire bond pads 127. Larger chip size in turn could result in low chip yield per given wafer, and high chip cost. Larger chip size also means longer leads on the chip and higher parasitic and low speed performance. Close proximity assembling of the waveguide or fiber connector 146 VCSEL 107 may be difficult resulting in a possible assembling yield loss. Also, hybrid level external lens integration often results in a coefficient of temperature expansion mismatch problem for an array product.

Figure 18A:
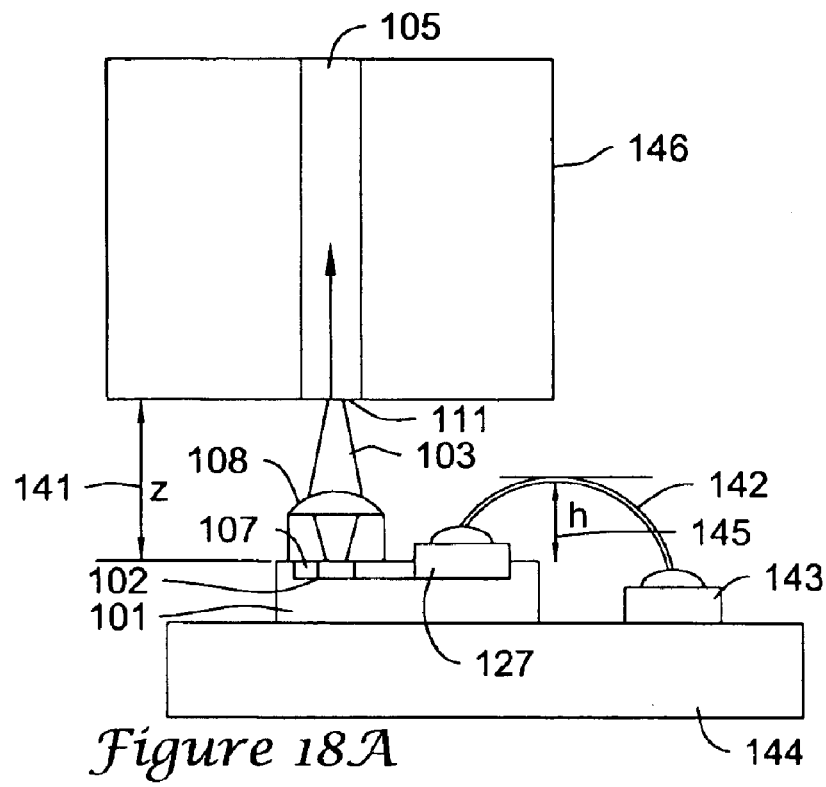
FIGS. 18a and 18b show the improvements of the standoff and lens integration approach relative to the approach in FIGS. 17a and 17b.
Figure 18B:
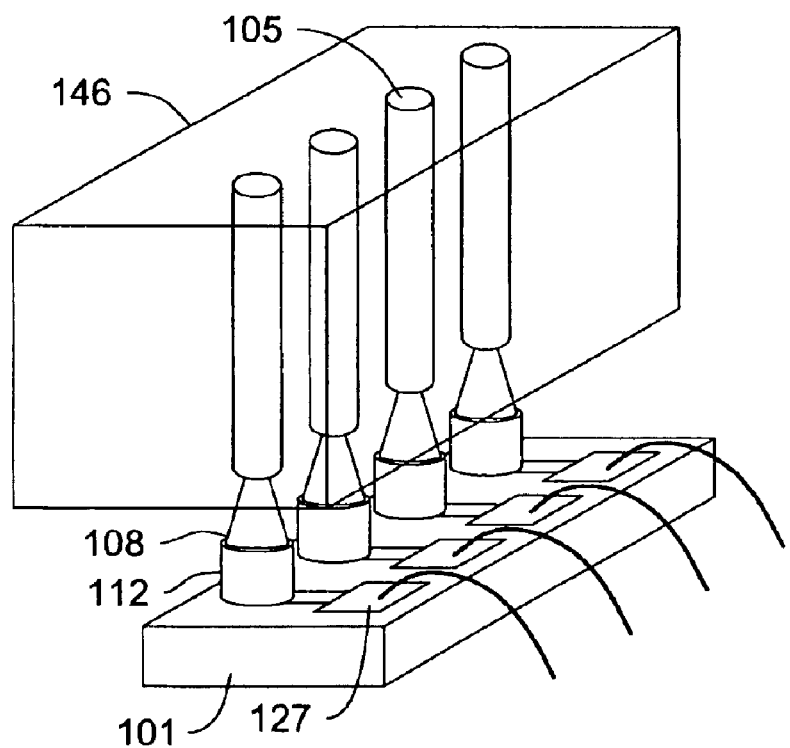

FIGS. 18a and 18b show the improvements of the standoff 112 and lens 108 integration approach relative to the approach in FIGS. 17a and 17b. Here distance 141 is greater than distance 145. It permits a smaller die 101 since there is no interference between connector 146 and bonding wire 142. A smaller die means better yield and lower cost, shorter bond wire 142, lower parasitics and a higher margin for high speed operation. Also, there is a better numerical aperture match between end 111 of optical waveguide or fiber 105 and aperture 102 of VCSEL 107. This match may result in more efficient coupling of light 103, which also help producing lower signal jitter and higher speed performance. Further, there is a larger working distance, more packaging flexibility, greater manufacturing tolerance and better yield of the device in production. Because the integrated lenses are individually distributed on the VCSEL chip, there is no coefficient of thermal expansion mismatch problem over wide range of temperature excursion.

Figure 19:
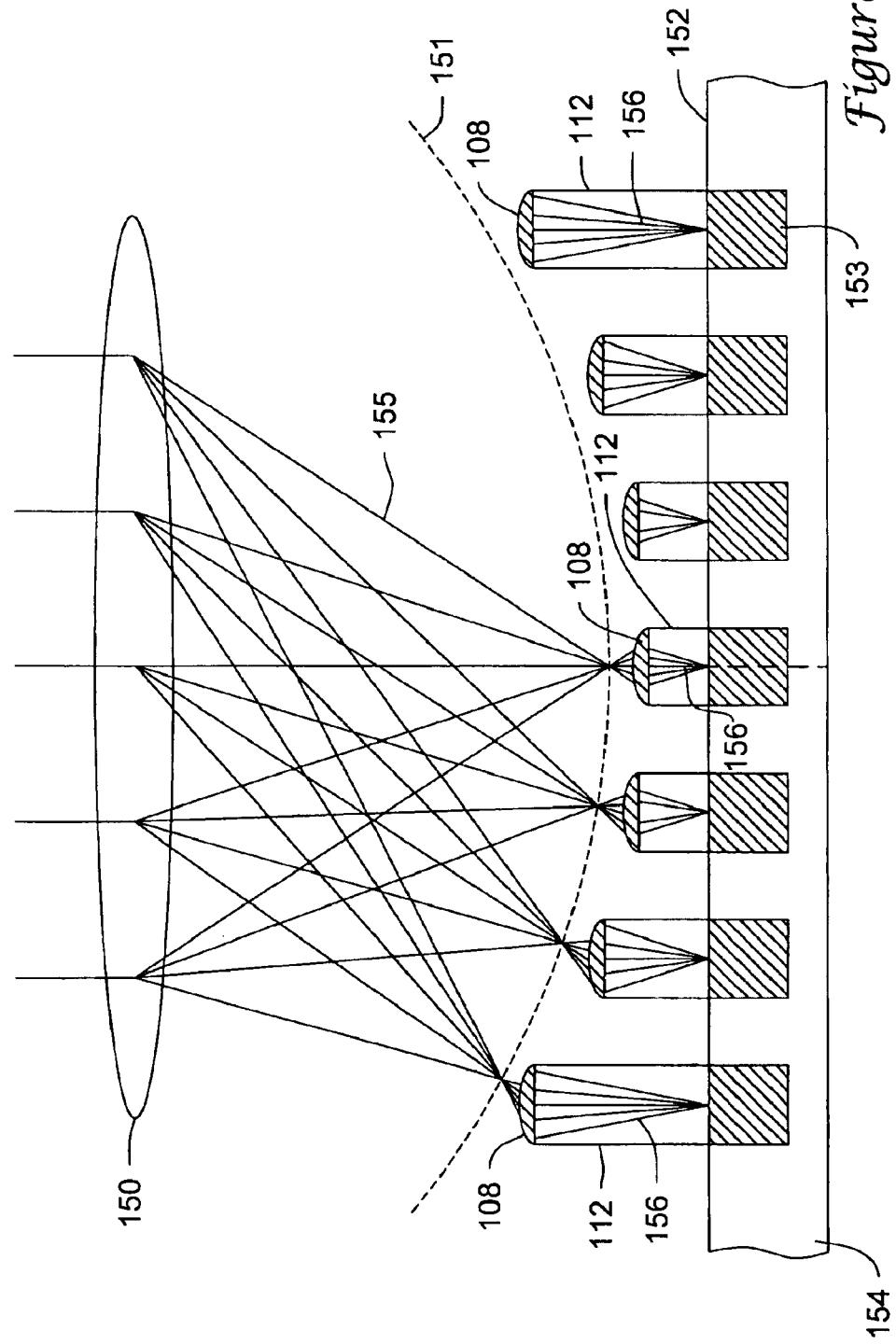
FIG. 19 reveals the use of standoffs, posts or spacers of various heights with micro lenses on a VCSEL wafer in a focal field flattener or planarizer.

The standoffs 112 and micro lens 108 may be used in correction or compensation of a curved or non-planar focal field 151 of fore optic 150 focal projected on a planar surface 152 having an array of opto-electronic devices 153 on a substrate 154. FIG. 19 reveals the use of standoffs 112 of various heights with micro lenses 108. Micro lenses 108 by themselves may have the same focal lengths. Standoffs, spacers or posts 112 of various lengths or heights provide the varied focal lengths for each of the lenses 108 relative to their position of focal field 151 of fore optic 150. These standoffs 112 provide the appropriate focal lengths 156 so that rays 155 are all focused on the optic electronic devices 153 on planar surface 152 of substrate or wafer 154.

FIG. 20 shows micro lenses 108 on standoffs, posts or spacers 112 situated on a substantially planar surface 157 of wafer or substrate 158. Substrate 158 may be made from a transparent material. Non-planar focal field 151 may be substantially planarized to surface 159 of substrate 158 with a combination of micro lenses 108 and standoffs 112 of various dimensions. Substrate 158 may be put adjacent to substrate 154 where surfaces 152 and 159 meet. The opto-electronic devices 153 are situated at the junction of surfaces 152 and 159 where the planarized focal field 151 occurs. Substrates 158 and 154 may be bonded where surfaces 152 and 159 meet. Opto-electronic devices 153 may be light detectors and/or emitters. Examples of detectors are CCDs and RCPDs. Examples of emitters are VCSELs and LEDs.

FIG. 21a shows a set of standoffs 112 of varying heights may be formed on substrate 154 having an array of opto-electronic devices 153. FIG. 21b shows standoffs 112 with lenses 108 formed on them. This is what is used for the focal field flattener or planarizer of FIG. 19.

Figure 22A:
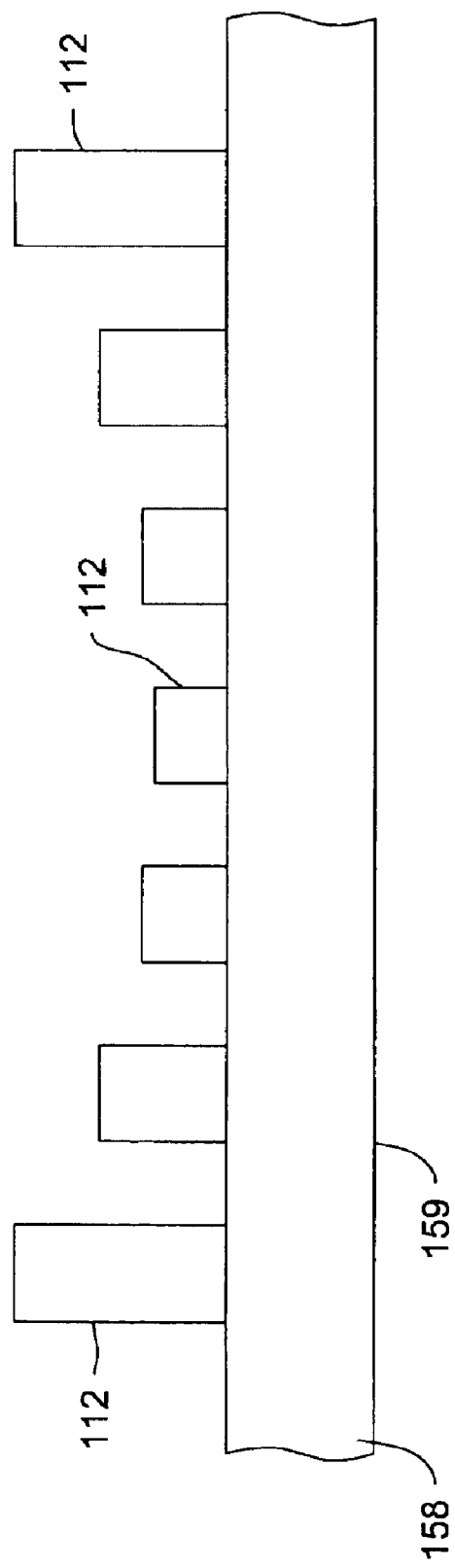

Standoffs 112 may be formed on a substrate 158 as in FIG. 22a. Lenses 108 may be formed on standoffs 112 as shown in FIG. 22b. Substrate 158 has a substantially planar surface 159 that may be attached or bonded to a wafer or substrate having a similar surface and the latter surface may have opto-electronic devices situated in it.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. An optical system, comprising:
   a plurality of opto-electronic devices situated substantially in a plane;
   a fore optic, having an optical axis, situated proximate to said plurality of opto-electronic devices; and
   a plurality of micro lenses situated between said plurality of opto-electronic devices and said fore optic; and
   wherein:
   each micro lens of said plurality of micro lenses is situated on a post.

2. The system of claim 1, wherein:
   said fore optic has a non-planar focal field; and
   each micro lens has focal length at least partially determined by a dimension of a respective post, to substantially planarize the non-planar focal field of said fore optic.

3. The system of claim 2, wherein each post is situated on an opto-electronic device of said plurality of opto-electronic devices.

4. The system of claim 3, wherein said plurality of opto-electronic devices is a plurality of opto-electronic emitters and/or detectors.

5. The system of claim 4, wherein each opto-electronic emitter is a VCSEL.

6. The system of claim 4, wherein each opto-electronic detector is a RCPD.

7. The system of claim 4, wherein each opto-electronic emitter is an LED.

8. The system of claim 4, wherein each opto-electronic detector is CCD.

9. The system of claim 2, wherein the focal length of each micro lens of said plurality of micro lenses increases with a distance increase away from the optical axis of said fore optic.

10. The system of claim 2, wherein the focal length of each micro lens is set for focus or relaying light between the said fore optic having the non-planar field, and a corresponding opto-electronic device.

11. The system of claim 2, wherein the optical axis of said fore optic is centered along a center axis of said plurality of opto-electronic devices.

12. The system of claim 2, wherein the optical axis of said fore optic is offset from a center axis of said plurality of opto-electronic devices.

13. A method for compensating for a non-planar focal field of a fore optic used in an optical system having a plurality of opto-electronic devices, comprising:
   providing a plurality of opto-electronic devices substantially in a plane;
   providing a fore optic having an optical axis;
   providing a plurality of micro lenses situated on a plurality of posts;
   setting the lengths of said plurality of posts to at least partially adjust the focal lengths of the plurality of micro lenses to compensate for the non-planar focal field of the fore optic.

14. The method of claim 13, wherein the plurality of the opto-electronic devices is a plurality of opto-electronic emitters and/or detectors.

15. The method of claim 14, wherein the opto-electronic emitters are VCSELs.

16. The method of claim 14, wherein the opto-electronic detectors are RCPDs.

17. The method of claim 14, wherein the opto-electronic emitters are LEDs.

18. The method of claim 14, wherein the opto-electronic detector are CCDs.

19. The method of claim 14, wherein the opto-electronic detectors are CCDs.

20. The method of claim 13, wherein the focal length of each micro lens of the plurality of micro lenses increases with a distance increase away from the optical axis of the fore optic.

21. The method of claim 13, wherein the focal length of each micro lens is set for each micro lens to focus or relay light between the fore optic having the non-planar focal field, and a corresponding opto-electronic device.

22. The method of claim 13, wherein the optical axis of the fore optic is centered along a center axis of the plurality of opto-electronic devices.

23. The method of claim 13, wherein the optical axis of the fore optic is offset from a center axis of the plurality of opto-electronic devices.

24. An optical system comprising:
   an array of opto-electronic devices situated substantially in a plane;
   a fore optic having a non-planar focal field, proximate to said array of opto-electronic devices;
   an array of micro lenses situated between said fore optic and said array of opto-electronic devices; and
   an array of spacers situated between said array of micro lenses and said array of opto-electronic devices; and
   wherein:
   each spacer provides a separation distance between each micro lens and each opto-electronic device; and
   the separation distance at least partially compensates for the non-planar focal field of said fore optic.

25. The system of claim 24, wherein the separation distance of each micro lens tracks the non-planar focal field of said fore optic to substantially planarize the focal field.

26. The system of claim 24, wherein each micro lens has a focal length related to its separation distance.

27. An optical system comprising:

a fore optic having a non-planar focal field;

a plurality of substantially optically transparent posts situated on a first surface of a first substrate;

a plurality of micro lenses situated on said plurality of posts; and wherein:

focal lengths of said plurality of said micro lenses are at least partially determined by distances of said plurality of posts between the micro lenses and the first surface of said first substrate; and the focal lengths of said plurality of said micro lenses are such as to compensate the non-planar focal field of said fore optic into a substantially planar focal field.

28. The optical system of claim 27, wherein:

a second surface of said first substrate is substantially planar; and the focal field of the fore optic is substantially planar at the second surface of said first substrate.

29. The optical system of claim 28, further comprising:

a plurality of opto-electronic devices situated on a first surface of a second substrate; and wherein the first surface of the second substrate is substantially planar.

30. The optical system of claim 29, wherein the second surface of the first substrate is attached to the first surface of the second substrate.

31. The optical system of claim 29, wherein the second surface of the first substrate is bonded to the first surface of the second substrate.

32. Means for planarizing a focal field, comprising:

means for focusing light having a non-planar focal field; and means for substantially planarizing the focal field; and wherein:

said means for substantially planarizing comprises means for focusing in increments;

the focusing in increments has various focal lengths for substantially planarizing the focal field; and the various focal lengths are at least partially provided by various supports for means for focusing.

33. The means of claim 32, further comprising means for supporting various length supports.

34. The means of claim 33, further comprising means for emitting and/or detecting light proximate to said means for substantially planarizing the focal field.

35. The means of claim 34, wherein said means for supporting various length supports has a substantially planar surface adjacent to said means for emitting and/or detecting light.

36. The means of claim 35, wherein said means for emitting and/or detecting light has a substantially planar surface adjacent to the substantially planar surface of said means for supporting various length supports.

* * * * *